(12) United States Patent
An et al.

(10) Patent No.: US 12,495,597 B2
(45) Date of Patent: Dec. 9, 2025

(54) SEMICONDUCTOR DEVICES

(71) Applicant: Samsung Electronics Co., Ltd., Suwon-si (KR)

(72) Inventors: Hokyun An, Seoul (KR); Bumsoo Kim, Hwaseong-si (KR); Hyunseung Kim, Bucheon-si (KR); Guangfan Jiao, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/392,870

(22) Filed: Dec. 21, 2023

(65) Prior Publication Data

US 2024/0162307 A1    May 16, 2024

Related U.S. Application Data

(63) Continuation of application No. 17/544,158, filed on Dec. 7, 2021, now Pat. No. 11,901,421, which is a
(Continued)

(30) Foreign Application Priority Data

Jul. 23, 2019 (KR) ............... 10-2019-0089016

(51) Int. Cl.
*H10D 64/00*   (2025.01)
*H01L 21/28*   (2006.01)
(Continued)

(52) U.S. Cl.
CPC ..... *H10D 64/118* (2025.01); *H01L 21/28088* (2013.01); *H01L 21/28185* (2013.01);
(Continued)

(58) Field of Classification Search
CPC .................................................. H01L 29/4236
See application file for complete search history.

(56) References Cited

U.S. PATENT DOCUMENTS

| 7,166,528 B2 | 1/2007 | Kim et al. |
| 7,339,215 B2 | 3/2008 | Chidambaram |

(Continued)

FOREIGN PATENT DOCUMENTS

| CN | 103681276 A | 3/2014 |
| KR | 10-2005-0091498 A | 9/2005 |

(Continued)

OTHER PUBLICATIONS

Office Action for Korean Application No. 10-2019-0089016 dated Jul. 25, 2024.
(Continued)

*Primary Examiner* — Yu-Hsi D Sun
(74) *Attorney, Agent, or Firm* — Harness, Dickey & Pierce, P.L.C.

(57) ABSTRACT

A semiconductor device may include a substrate, an interface insulation pattern, a gate insulation pattern, a threshold voltage controlling metal pattern and a conductive pattern. The interface insulation pattern may be formed on the substrate. The gate insulation pattern including an oxide having a dielectric constant higher than that of silicon oxide may be formed on the interface insulation pattern. The threshold voltage controlling metal pattern may be formed on the gate insulation pattern. The conductive pattern may be formed on the threshold voltage controlling metal pattern. First dopants including at least fluorine may be included within and at at least one surface of the gate insulation pattern and at an upper surface of an interface insulation pattern contacting the gate insulation pattern. The semiconductor device may have excellent electrical characteristics.

16 Claims, 18 Drawing Sheets

Related U.S. Application Data continuation of application No. 16/837,408, filed on Apr. 1, 2020, now Pat. No. 11,217,669.

(51) Int. Cl.
*H01L 21/3115* (2006.01)
*H10D 30/60* (2025.01)
*H10D 64/27* (2025.01)
*H10D 64/66* (2025.01)
*H10D 64/68* (2025.01)
*H10D 84/01* (2025.01)
*H10D 84/03* (2025.01)
*H10D 84/85* (2025.01)

(52) U.S. Cl.
CPC ......... *H01L 21/3115* (2013.01); *H10D 30/60* (2025.01); *H10D 64/513* (2025.01); *H10D 64/667* (2025.01); *H10D 64/685* (2025.01); *H10D 64/691* (2025.01); *H10D 84/0177* (2025.01); *H10D 84/0181* (2025.01); *H10D 84/038* (2025.01); *H10D 84/85* (2025.01)

(56) References Cited

U.S. PATENT DOCUMENTS

| | | | |
|---|---|---|---|
| 7,737,007 B2 | 6/2010 | Samoilov et al. | |
| 8,574,979 B2 | 11/2013 | Sridhar | |
| 9,059,005 B2 | 6/2015 | Cheng et al. | |
| 9,368,352 B2 | 6/2016 | Takamure et al. | |
| 9,634,011 B2 | 4/2017 | Kang et al. | |
| 9,911,627 B1 | 3/2018 | Or-Bach et al. | |
| 2006/0115967 A1 | 6/2006 | Park et al. | |
| 2008/0017930 A1 | 1/2008 | Kim et al. | |
| 2010/0096705 A1 | 4/2010 | Hung et al. | |
| 2013/0302952 A1* | 11/2013 | Luo | H01L 21/28052 257/E21.409 |
| 2013/0330900 A1 | 12/2013 | Pandey et al. | |
| 2014/0077313 A1 | 3/2014 | Li et al. | |
| 2015/0325670 A1* | 11/2015 | Kim | H01L 21/28194 438/591 |
| 2018/0012767 A1 | 1/2018 | Aoyama | |
| 2019/0139759 A1* | 5/2019 | Cheng | H01L 21/02321 |

FOREIGN PATENT DOCUMENTS

| | | |
|---|---|---|
| KR | 10-2014-0003864 A | 1/2014 |
| KR | 10-2016-0126147 A | 11/2016 |
| KR | 10-2018-0070780 A | 6/2018 |
| KR | 10-2019-0033770 A | 4/2019 |

OTHER PUBLICATIONS

Office Action issued Jan. 11, 2024 in Chinese Application No. 202010708917.2.

Non-Final Office Action dated Jan. 27, 2021, for corresponding U.S. Appl. No. 16/837,408.

Chinese Office Action dated Aug. 24, 2023 for corresponding Chinese Patent Application No. 202010708917.2.

Notice of Allowance for Korean Application No. 10-2019-0089016 dated Mar. 25, 2025.

* cited by examiner

SEMICONDUCTOR DEVICES

CROSS-REFERENCE TO RELATED APPLICATION

The present application is a continuation of and claims priority under 35 U.S.C. § 120 to U.S. patent application Ser. No. 17/544,158, filed on Dec. 7, 2021, which is a continuation of and claims priority under 35 U.S.C. § 120 to U.S. patent application Ser. No. 16/837,408, filed on Apr. 1, 2020, which claims the benefit of Korean Patent Application No. 10-2019-0089016, filed on Jul. 23, 2019, in the Korean Intellectual Property Office (KIPO), the contents of which are incorporated by reference herein in their entirety.

BACKGROUND

1. Field

Example embodiments relate to semiconductor devices. More particularly, example embodiments relate to semiconductor devices including transistors.

2. Description of the Related Art

A transistor included in a semiconductor device should have sufficient electrical properties. For example, the transistor may have a reduced leakage current and/or a larger on current. In order to improve the electrical properties of the transistor, a gate structure may include a gate insulation layer having a small defect.

SUMMARY

Example embodiments provide a semiconductor device having sufficient characteristics.

Example embodiments provide methods of manufacturing the semiconductor device.

According to example embodiments, there is provided a semiconductor device that may include a substrate, an interface insulation pattern, a gate insulation pattern, a threshold voltage controlling metal pattern and a conductive pattern. The interface insulation pattern may be on the substrate. The gate insulation pattern may be on the interface insulation pattern. The gate insulation pattern may include an oxide having a dielectric constant higher than that of silicon oxide. The threshold voltage controlling metal pattern may be on the gate insulation pattern. The conductive pattern may be on the threshold voltage controlling metal pattern. First dopants may be present within and at at least one surface of the gate insulation pattern and at an upper surface of the interface insulation pattern contacting the gate insulation pattern. The first dopants may include at least fluorine.

According to example embodiments, there is provided a semiconductor device that may include a substrate, an interface insulation pattern, a gate insulation pattern, a threshold voltage controlling metal pattern, a conductive pattern and impurity regions. The substrate may include a recess. The interface insulation pattern may be conformal to a surface of the recess. The gate insulation pattern may be on the interface insulation pattern. The gate insulation pattern may include an oxide having a dielectric constant higher than that of silicon oxide. The threshold voltage controlling metal pattern may be on the gate insulation pattern. The conductive pattern may be formed on the threshold voltage controlling metal pattern. The conductive pattern may include a polysilicon pattern doped with N-type or P-type impurities and an upper metal pattern including a metal having a resistance lower than that of the polysilicon pattern. The impurity regions serving as source/drain regions may be in the substrate on adjacent sides of the recess. The first dopants may be present within and at at least one surface of the gate insulation pattern and at an upper surface of the interface insulation pattern contacting the gate insulation pattern. The first dopants may include at least fluorine. A stacked structure including the interface insulation pattern, the gate insulation pattern, the threshold voltage controlling metal pattern and the conductive pattern may be in the recess.

According to example embodiments, there is provided a semiconductor device that may include a substrate, a gate insulation pattern and a conductive pattern. The substrate may include a recess. The gate insulation pattern may be conformal to the substrate. The conductive pattern may be on the gate insulation pattern. The conductive pattern may include a polysilicon pattern doped with N-type or P-type impurities and an upper metal pattern. First dopants may be in the gate insulation pattern and at an upper and on lower interfaces of the gate insulation pattern. The first dopants may include at least fluorine. A stacked structure including the gate insulation pattern and the conductive pattern may be in the recess.

According to example embodiments, there is provided a method of manufacturing a semiconductor device. In the method, a preliminary gate insulation layer may be formed on a substrate. A lower polysilicon layer may be formed on the preliminary gate insulation layer. The lower polysilicon layer may be doped with first dopants including at least fluorine. The first dopants included in the lower polysilicon may be diffused within and at an upper and lower interface of the preliminary gate insulation to form a gate insulation layer including the first dopants within and at at least one of an upper and lower interface thereof. A polysilicon layer may be formed on the gate insulation layer. The polysilicon may be doped with N-type or P-type impurities. The polysilicon layer and the gate insulation layer may be patterned to form a gate structure including a gate insulation pattern and a polysilicon pattern on the substrate.

In example embodiments, in a transistor of the semiconductor device, the first dopants including at least fluorine may be included within and at at least one surface of the gate insulation pattern and at an upper surface of an interface insulation pattern contacting the gate insulation pattern. Defects may be cured by the first dopants, so that the defects of the upper surface of the interface insulation pattern contacting the gate insulation pattern and the gate insulation pattern may be reduced. Thus, the transistor has a reduced leakage current due to the defects, and may have a higher on current. Therefore, the semiconductor device may have improved electrical characteristics.

BRIEF DESCRIPTION OF THE DRAWINGS

Example embodiments will be more clearly understood from the following detailed description taken in conjunction with the accompanying drawings. FIGS. 1 to 25 represent non-limiting, example embodiments as described herein.

FIG. 1 is a cross-sectional view illustrating a transistor in accordance with example embodiments;

FIG. 2 is a cross-sectional view illustrating a semiconductor device in accordance with example embodiments;

FIGS. 3, 4A, 5 to 6 are cross-sectional views illustrating stages of a method of manufacturing a semiconductor device in accordance with example embodiments;

FIG. 7 is a cross-sectional view illustrating a semiconductor device in accordance with example embodiments;

FIG. 8 is a cross-sectional view illustrating a semiconductor device in accordance with example embodiments;

FIGS. 9 and 10 are cross-sectional views illustrating stages of a method of manufacturing a semiconductor device in accordance with example embodiments;

FIG. 11 is a cross-sectional view illustrating a semiconductor device in accordance with example embodiments;

FIGS. 12 and 13 are cross-sectional views illustrating stages of a method of manufacturing a transistor in accordance with example embodiments;

FIG. 14 is a cross-sectional view illustrating a semiconductor device in accordance with example embodiments;

FIG. 15 is a cross-sectional view illustrating a semiconductor device in accordance with example embodiments;

FIG. 16 is a cross-sectional view illustrating a semiconductor device in accordance with example embodiments;

FIG. 17 is a cross-sectional view illustrating a semiconductor device in accordance with example embodiments;

FIG. 18 is a cross-sectional view illustrating a semiconductor device in accordance with example embodiments;

FIG. 19 is a cross-sectional view illustrating a semiconductor device in accordance with example embodiments;

FIGS. 20 to 24 are cross-sectional views illustrating stages of a method of manufacturing a semiconductor device in accordance with example embodiments; and FIG. 25 is a cross-sectional view illustrating a semiconductor device in accordance with example embodiments.

DESCRIPTION OF EMBODIMENTS

Figure 1:
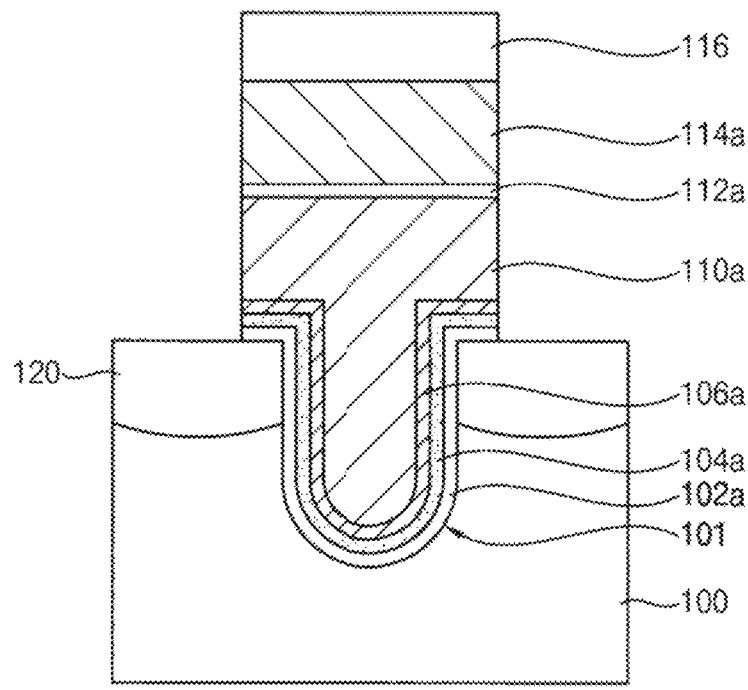

FIG. 1 is a cross-sectional view illustrating a transistor in accordance with example embodiments. The transistor shown in FIG. 1 may be a recessed channel transistor.

Referring to FIG. 1, a substrate 100 may include a semiconductor material such as single crystal silicon.

A recess 101 may be formed at a portion of the substrate 100 for forming a gate structure. In example embodiments, the recess 101 may extend in a first direction parallel to a surface of the substrate 100.

The recess 101 may have a first depth from the surface of the substrate 100. A gate structure may fill the recess 101, and the gate structure may protrude from an upper surface of the substrate 100.

An interface insulation pattern 102a may be conformally formed on a sidewall and a bottom of the recess 101. In example embodiments, the interface insulation pattern 102a may extend to the upper surface of the substrate 100 adjacent to the recess 101.

In example embodiments, the interface insulation pattern 102a may include silicon oxide or silicon oxynitride. The interface insulation pattern 102a may be formed to reduce or prevent the substrate 100 and a gate insulation pattern 104a from directly contacting to each other. Thus, the interface insulation pattern 102a may be interposed between the substrate 100 and the gate insulation pattern 104a.

The gate insulation pattern 104a may be conformally formed on the interface insulation pattern 102a. In example embodiments, the gate insulation pattern 104a may include an oxide having a high dielectric constant. For example, the gate insulation pattern 104a may have a dielectric constant higher than that of silicon oxide. The gate insulation pattern 104a may be, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide or the like.

In example embodiments, first dopants may be included in the gate insulation pattern 104a and on upper and lower interfaces of the gate insulation pattern 104a. That is, the first dopants may be included within and at a surface of the gate insulation pattern 104a and at an upper surface of the interface insulation pattern 102a contacting the gate insulation pattern 104a. The first dopants may be doped to cure crystal defects included within and at at least one surface of the gate insulation pattern 104a and the upper surface of the interface insulation pattern 102a contacting the gate insulation pattern 104a. That is, the first dopants may be combined with dangling bonds or vacancy included within and at a surface of the gate insulation pattern 104a and the upper surface of the interface insulation pattern 102a contacting the gate insulation pattern 104a, so that defects of the upper and lower interfaces of the gate insulation pattern 104a and the gate insulation pattern 104a may be cured (or removed).

A concentration of the first dopants may be decreased at a constant rate from the upper surface of the gate insulation pattern 104a toward an inside of the gate insulation pattern 104a. That is, the first dopants may not have a curve gradient in which concentration is greatly increased or decreased at specific regions within the gate insulation pattern 104a. Thus, the first dopants included in the gate insulation pattern 104a may have a uniform concentration at each position having the same distance from the upper surface of the gate insulating pattern 104a. The concentration of the first dopants included in the gate insulation pattern 104a may have high uniformity. That is, even though the gate insulation pattern 104a is conformally formed on the surface of the recess 101, a concentration gradient of the first dopants may not be large. Thus, defects of the gate insulation pattern 104a may be cured by the first dopants, so that the gate insulation pattern 104a may have excellent characteristics. Therefore, leakage currents of the transistor due to the defects of the gate insulation pattern 104a may be decreased.

In example embodiments, the first dopants may include a material having a chemical bonding strength higher than that of hydrogen. In example embodiments, the first dopants may include fluorine. In example embodiments, the first dopants may include fluorine, and may further include nitrogen, phosphorus, boron, or gallium.

A threshold voltage controlling metal pattern 106a may be formed on the gate insulation pattern 104a. The threshold voltage controlling metal pattern 106a may include, e.g., TiN, TiSiN, TiAlN, TaN, AlN, WN, MoN, WCN, La, LaO, LaN, cadmium, chromium, yttrium, cerium, scandium, strontium, erbium, or the like. The materials may be used alone or two or more stacked.

In example embodiments, when an NMOS transistor is formed, the threshold voltage controlling metal pattern 106a directly contacting the gate insulation pattern 104a may include an N-type metal having a first work function. For example, the N-type metal may include La, LaO, and/or LaN.

In example embodiments, when a PMOS transistor is formed, the threshold voltage controlling metal pattern 106a directly contacting the gate insulation pattern 104a may have a P-type metal having a second work function higher than the first work function. For example, the P-type metal may include TiN.

In example embodiments, the threshold voltage controlling metal pattern 106a may further include dopants substantially the same as the first dopants.

A polysilicon pattern 110a may be formed on the threshold voltage controlling metal pattern 106a. The polysilicon pattern 110a may be doped with conductive impurities such as N-type impurities or P-type impurities. For example, the polysilicon pattern may be doped with impurities such as As, Sb, P, B, and In. In example embodiments, the polysilicon pattern 110a may directly contact the threshold voltage controlling metal pattern 106a.

In example embodiments, the polysilicon pattern 110a may completely fill remaining space of the recess 101. In example embodiments, an upper surface of the polysilicon pattern 110a may be higher than the upper surface of the substrate 100.

An upper metal pattern 114a and a hard mask pattern 116 may be formed on the polysilicon pattern 110a. The upper metal pattern 114a may be formed to decrease a resistance of the gate electrode. Thus, the upper metal pattern 114a may include a metal having a resistance lower than that of the polysilicon pattern 110a. The upper metal pattern 114a may include, e.g., tungsten, aluminum, copper, cobalt, or the like.

In example embodiments, a diffusion barrier pattern 112a may be further formed between the polysilicon pattern 110a and the upper metal pattern 114a. The diffusion barrier pattern 112a may be reduce or prevent impurities of the polysilicon pattern 110a from diffusing upwardly. Also, the diffusion barrier pattern 112a may serve as an adhesion layer for contacting between the upper metal pattern 114a and the polysilicon pattern 110a. The diffusion barrier pattern 112a may include, e.g., a metal or metal nitride such as titanium, tantalum, titanium nitride (TiNx), TiSiN, TiAlN, TaN, AlN, tungsten nitride (WNx), or the like.

The hard mask pattern 116 may include, e.g., silicon nitride or silicon oxide.

As described above, a gate structure including the interface insulation pattern 102a, the gate insulation pattern 104a, the threshold voltage controlling metal pattern 106a, the polysilicon pattern 110a, the diffusion barrier pattern 112a, the upper metal pattern and/or the hard mask stacked may be formed in the recess. The polysilicon pattern 110a, the diffusion barrier pattern 112a and/or the upper metal pattern 114a may serve as a conductive pattern.

Impurity regions 120 may be formed at upper portions of the substrate 100 adjacent sides of the gate structure. The impurity regions 120 may serve as source/drain regions.

In example embodiments, the transistor of the semiconductor device may serve as a peripheral circuit of a memory device. The memory device may be a DRAM device, an SRAM device, a flash memory device, a logic device, or the like. In some example embodiments, the transistor may serve as a part of a memory cell in a DRAM device.

As described above, the first dopants may be uniformly included in the gate insulation pattern 104a and on the upper and lower interfaces of the gate insulation pattern 104a, so that the transistor may have improved electrical characteristics.

Figure 2:
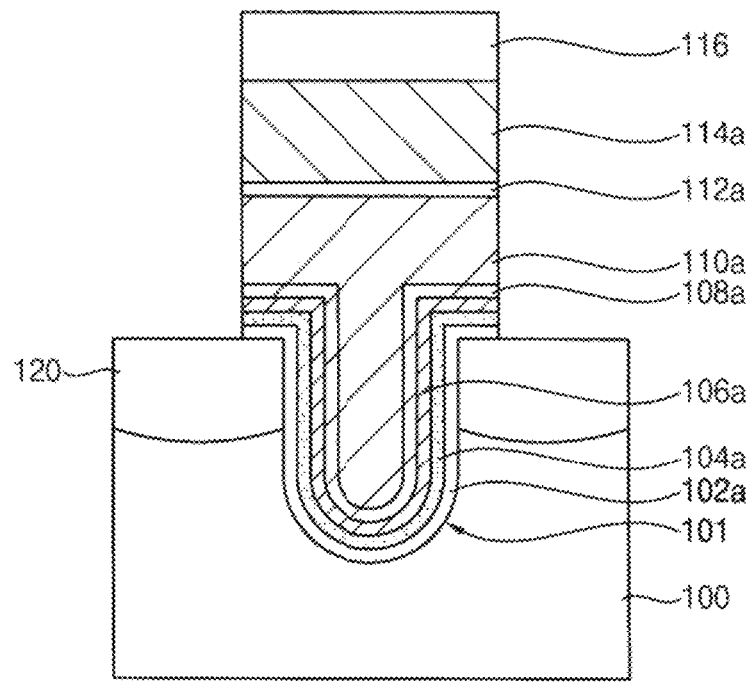

FIG. 2 is a cross-sectional view illustrating a semiconductor device in accordance with example embodiments.

The semiconductor device shown in FIG. 2 may be substantially the same as the semiconductor device shown in FIG. 1, except for a stacked structure of the gate structure.

Referring to FIG. 2, the gate structure may include the interface insulation pattern 102a, the gate insulation pattern 104a, the threshold voltage controlling metal pattern 106a, a lower polysilicon pattern 108a, the polysilicon pattern 110a, the diffusion barrier pattern 112a, the upper metal pattern 114a and/or the hard mask pattern 116 stacked. That is, the lower polysilicon pattern 108a may be further formed between the threshold voltage controlling metal pattern 106a and the polysilicon pattern 110a.

In example embodiments, the lower polysilicon pattern 108a may be conformally formed on the threshold voltage controlling metal pattern 106a. That is, the lower polysilicon pattern 108a may directly contact the threshold voltage controlling metal pattern 106a. The lower polysilicon pattern 108a formed on the threshold voltage controlling metal pattern 106a may have a uniform thickness. Also, the lower polysilicon pattern 108a may not completely fill the recess 101.

In example embodiments, the lower polysilicon pattern 108a may be doped with second dopants which may be substantially the same as the first dopants doped in the gate insulation pattern 104a. That is, the second dopants may include fluorine. In some example embodiments, the second dopants may include fluorine, and may further include nitrogen, phosphorus, boron or gallium.

The lower polysilicon pattern 108a may be a doping source layer for doping first dopants to the gate insulation pattern 104a formed below. That is, second dopants doped in the lower polysilicon pattern 108a may be downward diffused to form the first dopants included in the gate insulation pattern 104a.

The lower polysilicon pattern 108a may have a thickness less than that of the polysilicon pattern 110a. For example, the lower polysilicon pattern 108a may have a thickness of about 5 Å to about 100 Å. When the lower polysilicon pattern 108a is less than 5 Å, the lower polysilicon pattern 108a may not be served as a doping source layer for doping first dopants. When the lower polysilicon pattern 108a is greater than 100 Å, a resistance of the gate structure may increase.

FIGS. 3, 4A, 5 to 6 are cross-sectional views illustrating stages of a method of manufacturing a semiconductor device in accordance with example embodiments. FIG. 4B is concentration gradients of dopants when implanting dopants by ion implantation, and by diffusion from a polysilicon layer, respectively Referring to FIG. 3, an upper portion of a substrate 100 may be partially etched to form a recess 101. An interface insulation layer 102 may be conformally formed on an inner surface of the recess 101 and an upper surface of the substrate 100.

In example embodiments, the process of forming the interface insulation layer 102 may include a radical oxidation process, an in situ steam generation (ISSG) process or a UV oxidation process.

In example embodiments, a plasma nitridation and a heat treatment may be additionally performed after forming the interface insulation layer 102. The plasma nitridation process may include a radical flow nitridation (RFN) or a decoupled plasma nitridation (DPN).

A preliminary gate insulation layer 103 may be conformally formed on the interface insulation layer 102. A threshold voltage controlling metal layer 106 may be conformally formed on the preliminary gate insulation layer 103. A process for forming the preliminary gate insulation layer 103 may include a chemical vapor deposition process or an atomic layer deposition process.

In example embodiments, the plasma nitridation process and the heat treatment process may be further performed after forming the preliminary gate insulation layer 103. The heat treatment process may include, e.g., a peak thermal anneal (RTA), a spike RTA, a millisecond anneal or the like.

Figure 4A:
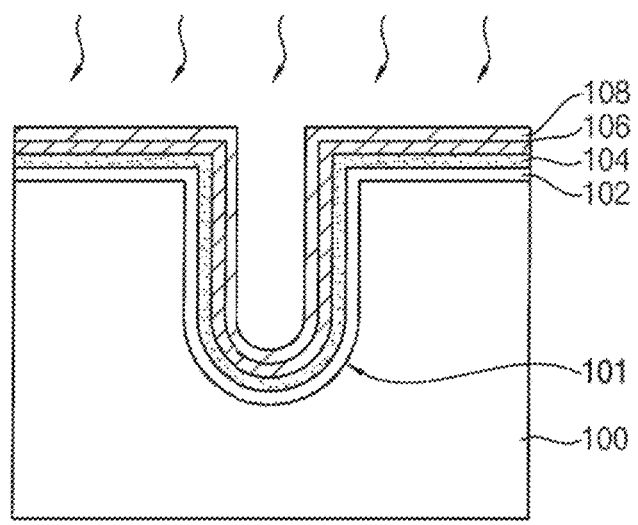

Referring to FIG. 4A, a lower polysilicon layer 108 may be conformally formed on the threshold voltage controlling metal layer 106. During deposition process for forming the lower polysilicon layer 108, second dopants may be doped in situ. Therefore, the second dopants may be uniformly doped into the lower polysilicon layer 108.

In example embodiments, the second dopants included in the lower polysilicon layer 108 may include fluorine. For example, the second dopants may include F or $BF_2$. In some embodiments, the second dopants included in the lower polysilicon layer 108 may include fluorine, and may further include nitrogen, phosphorus, boron, or gallium.

The lower polysilicon layer 108 may be a doping source layer for doping first dopants to the preliminary gate insulation layer 103. Thus, a concentration of second dopants doped in the lower polysilicon pattern 108a may be controlled, so that amount of the first dopants included in the gate insulation layer may be controlled. In example embodiments, the concentration of the second dopants doped in the lower polysilicon layer 108 may be controlled, e.g., in the range of about 0.1% to about 20%.

In example embodiments, the lower polysilicon layer 108 may have a uniform thickness from a surface of the threshold voltage controlling metal layer 106. Also, the lower polysilicon layer 108 may not completely fill the recess 101. The amount of the first dopants included in the gate insulation layer may be controlled by a thickness of the lower polysilicon layer 108.

In example embodiments, when the lower polysilicon layer 108 is removed by subsequent processes, the lower polysilicon layer 108 may be formed to have a thickness of about 5 Å to about 300 Å.

In some example embodiments, when the lower polysilicon layer 108 is not removed by subsequent processes, the lower polysilicon layer 108 may be formed to have a thin thickness of about 5 Å to about 100 Å.

Then, the lower polysilicon layer 108 may be heat-treated to downwardly diffuse the second dopants in the lower polysilicon layer 108, so that a gate insulation layer 104 doped with first dopants may be formed. The first dopants may be substantially the same as the second dopants. The first dopants may be included in the gate insulation layer 104 and on upper and lower interfaces of the gate insulation layer 104. That is, the first dopants may be included within and at at least one surface of the gate insulation layer 104 and at an upper surface of the interface insulation layer 102 contacting the gate insulation layer 104. The heat treatment process may be performed, e.g., at a temperature of about 700° C. to about 1000° C.

In the FIG. 4B, a reference numeral 10 is concentration gradients of dopants when the dopants are implanted by the ion implantation process. Also, a reference numeral 12 is concentration gradients of dopants when the dopants are doped by diffusion from a polysilicon layer.

When dopants are implanted by an ion implantation process into a layer 14 having a flat upper surface, a region of a certain depth from the upper surface of the layer 14 may have a high doping concentration. When the ion implantation process is performed, the doping concentration may have a curved gradient, so that the dopants may not be uniformly doped into the layer 14.

Further, when the dopants are implanted in the preliminary gate insulation layer by the ion implantation process, angles of ion implanted into the preliminary gate insulation layer may be different from each other, according to positions of the surfaces of the preliminary gate insulation layer. That is, an angle of ion implanted into the preliminary gate insulation layer formed on the sidewalls of the recess and an angle of ion implanted into the preliminary gate insulation layer formed on the bottom of the recess may be different from each other. Thus, the dopants may not be uniformly doped into portions of the preliminary gate insulation layer formed on the sidewall and the bottom of the recess 101.

In addition, when dopants are implanted into the preliminary gate insulation layer by the ion implantation process, the surface of the substrate and the layers may be damaged by the ion implantation. However, the first dopants may be uniformly doped into the gate insulation layer 104 by diffusing the second dopants in the lower polysilicon layer 108 downwardly. When the diffusion process is performed, the doping concentration may not have a curved gradient. When the dopants are doped by the diffusion process, a concentration of the dopants may be decreased at a constant rate from the upper surface of the preliminary gate insulation layer 103 toward an inside of the preliminary gate insulation layer 103. Therefore, the concentration of first dopants included in the gate insulation layer 104 may have a high uniformity.

In example embodiments, when the second dopants are downwardly diffused, dopants may be partially doped in the threshold voltage controlling metal layer 106. Therefore, the threshold voltage controlling metal layer 106 may be doped with a third dopants substantially the same as the first dopants.

Figure 5:
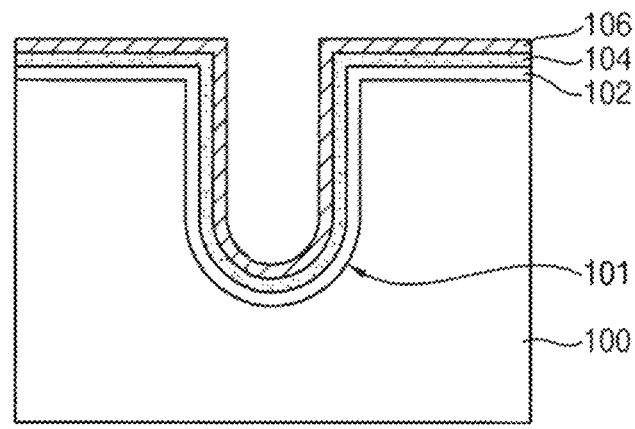

Referring to FIG. 5, the lower polysilicon layer 108 may be removed. The removing process of the lower polysilicon layer 108 may include an isotropic etching process.

In some example embodiments, the removing process for the lower polysilicon layer 108 may not be performed. If subsequent processes are performed in the same manner without removing the lower polysilicon layer 108, the semiconductor device shown in FIG. 2 may be manufactured.

Although not shown, in some example embodiments, a sequence of the processes described above may be changed. For example, before forming the threshold voltage controlling metal layer 106, the lower polysilicon layer 108 may be formed on the preliminary gate insulation layer 103, and then second dopants included in the lower polysilicon layer 108 may be downwardly diffused to form a gate insulation layer 104 including the first dopants. In addition, after forming the gate insulation layer, the lower polysilicon layer 108 may be removed. Thereafter, the threshold voltage controlling metal layer 106 may be formed on the gate insulation layer 104. In example embodiments, the threshold voltage controlling metal layer 106 may not include the dopants the same as the first dopants.

Figure 6:
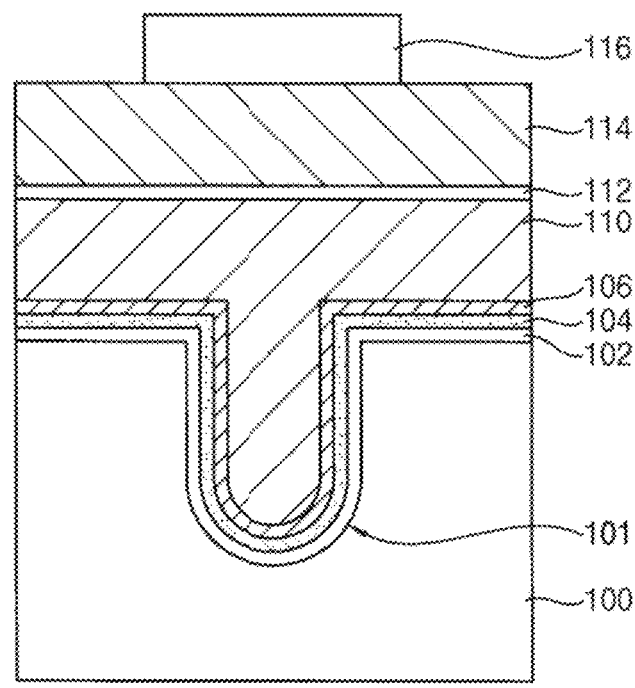

Referring to FIG. 6, a polysilicon layer 110 may be formed on the threshold voltage controlling metal layer 106. During the deposition process for forming the polysilicon layer 110, N-type impurities or P-type impurities may be doped in situ. The polysilicon layer 110 may be formed to fill remaining space of the recess 101.

A diffusion barrier layer 112, an upper metal layer 114 and a hard mask layer may be sequentially formed on the polysilicon layer 110. The hard mask layer may be patterned to form a hard mask pattern 116.

Referring to FIG. 1 again, the upper metal layer 114, the diffusion barrier layer 112, the polysilicon layer 110, the threshold voltage controlling metal layer 106, the gate insulation layer 104 and the interface insulation layer 102 may be etched using the hard mask pattern as an etching mask to form a gate structure in the recess. The gate structure may include an interface insulation pattern 102a, a gate insulation pattern 104a, a threshold voltage controlling metal pattern 106a, a polysilicon pattern 110a, a diffusion barrier pattern 112a, an upper metal pattern 114a and the hard mask pattern 116 stacked.

Thereafter, impurities may be doped on the substrate 100 to form impurity regions 120 at upper portions of the substrate 100 adjacent to sides of the gate structure. In example embodiments, a bottom of each of the impurity regions 120 may be higher than a bottom of the recess 101.

In some example embodiments, the doping process for forming the impurity regions 120 may be performed before forming the recess 101 illustrated with reference to FIG. 3.

Figure 7:
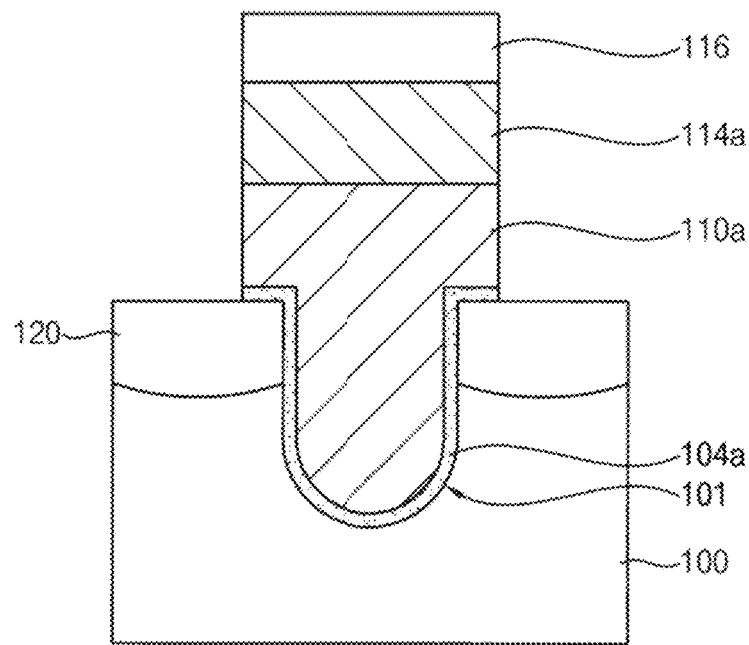

FIG. 7 is a cross-sectional view illustrating a semiconductor device in accordance with example embodiments.

The semiconductor device shown in FIG. 7 may be substantially the same as the semiconductor device shown in FIG. 1, except for a stacked structure of the gate structure.

Referring to FIG. 7, the gate structure may include the gate insulation pattern 104a, the polysilicon pattern 110a, the upper metal pattern 114a and/or the hard mask pattern 116.

The gate insulation pattern 104a may be conformally formed on a sidewall and a bottom of the recess 101. In example embodiments, the gate insulation pattern 104a may include silicon oxide.

In example embodiments, the first dopants may be doped in the gate insulation pattern 104a and on upper and lower interfaces of the gate insulation pattern 104a. That is, the first dopants may be doped within and at a surface of the gate insulation pattern 104a and at an upper surface of the substrate 100 contacting the gate insulation pattern 104a.

The polysilicon pattern 110a may be formed on the gate insulation pattern 104a. The polysilicon pattern 110a may be doped with N-type impurities or P-type impurities. The polysilicon pattern 110a may fill remaining space of the recess 101. In example embodiments, an upper surface of the polysilicon pattern 110a may be higher than an upper surface of the substrate 100.

The upper metal pattern 114a and the hard mask pattern 116 may be substantially the same as those illustrated with reference to FIG. 1, respectively. In some example embodiments, a diffusion barrier pattern (not shown) may be further formed between the polysilicon pattern 110a and the upper metal pattern 114a.

Figure 8:
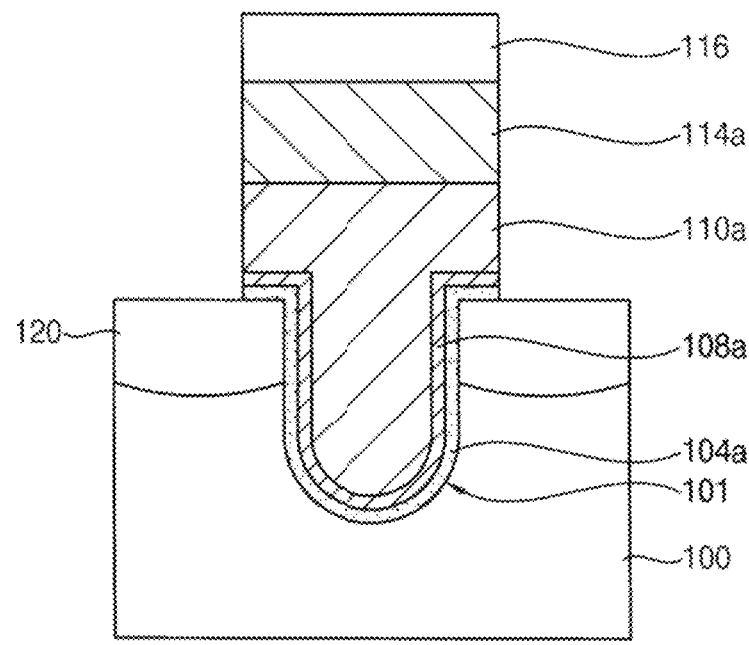

FIG. 8 is a cross-sectional view illustrating a semiconductor device in accordance with example embodiments.

The semiconductor device shown in FIG. 8 may be substantially the same as the semiconductor device shown in FIG. 7, except for a stacked structure of the gate structure.

Referring to FIG. 8, the gate structure may include the gate insulation pattern 104a, the lower polysilicon pattern 108a, the polysilicon pattern 110a, the upper metal pattern 114a and/or the hard mask pattern 116. That is, the lower polysilicon pattern 108a may be further formed between the gate insulation pattern 104a and the polysilicon pattern 110a. The lower polysilicon pattern 108a may be substantially the same as that illustrated with reference to FIG. 2. In some example embodiments, a diffusion barrier pattern (not shown) may be further formed between the polysilicon pattern 110a and the upper metal pattern 114a.

Figure 9:
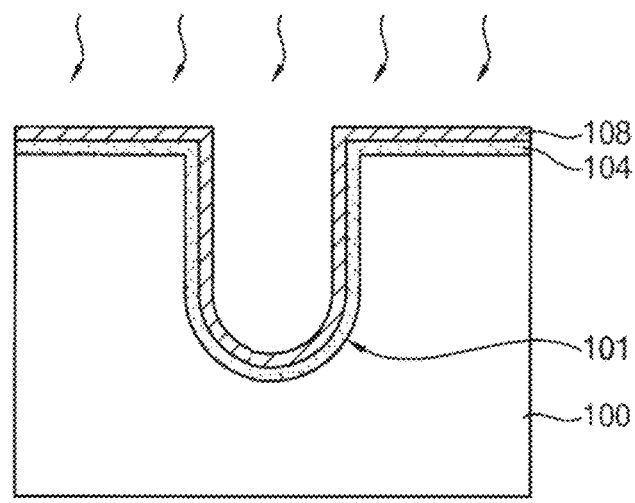
Figure 10:
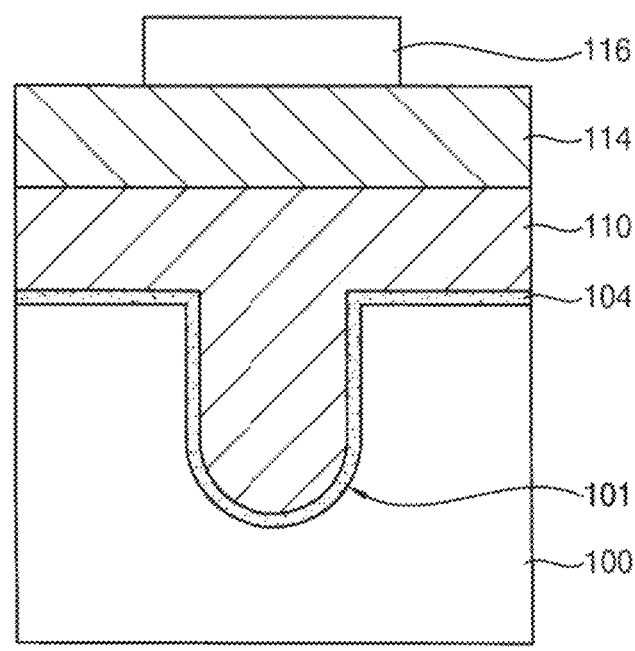

FIGS. 9 and 10 are cross-sectional views illustrating stages of a method of manufacturing a semiconductor device in accordance with example embodiments.

Referring to FIG. 9, an upper portion of the substrate 100 may be partially etched to form the recess 101. A preliminary gate insulation layer may be conformally formed on an inner surface of the recess 101 and an upper surface of the substrate 100.

In example embodiments, a plasma nitridation and a heat treatment may be further performed, after forming the preliminary gate insulation layer.

The lower polysilicon layer 108 may be conformally formed on the preliminary gate insulation layer. The second dopants may be doped in situ, during the deposition process of forming the lower polysilicon layer 108. The process for forming the lower polysilicon layer 108 may be substantially the same as that illustrated with reference to FIG. 4.

Thereafter, the lower polysilicon layer 108 may be heat-treated to downwardly diffuse the second dopants in the lower polysilicon layer 108, so that the gate insulation layer 104 doped with first dopants may be formed. The first dopants may be doped in the gate insulation layer 104 and on upper and lower interfaces of the gate insulation layer 104, and the first dopants may be substantially the same as the second dopants. That is, the first dopants may be doped within and at at least one surface of the gate insulation layer 104 and a surface of the substrate 100 contacting the gate insulation layer 104.

Referring to FIG. 10, the lower polysilicon layer 108 may be removed. The removing process of the lower polysilicon layer 108 may include an isotropic etching process.

In some example embodiments, the removing process of the lower polysilicon layer 108 may not be performed. When subsequent processes are performed in the same manner without removing the lower polysilicon layer 108, the semiconductor device shown in FIG. 8 may be manufactured.

Thereafter, the polysilicon layer 110 may be formed on the gate insulation layer 104. During deposition process for forming the polysilicon layer 110, N-type impurities or P-type impurities may be doped in situ.

The upper metal layer 114 and the hard mask layer may be sequentially formed on the polysilicon layer 110. The hard mask layer may be patterned to form a hard mask pattern 116. In some example embodiments, the diffusion barrier layer may be further formed between the polysilicon layer 110 and the upper metal layer 114.

Referring to FIG. 7 again, the upper metal layer 114, the polysilicon layer 110 and the gate insulation layer 104 may be etched using the hard mask pattern 116 as an etch mask. Thus, a gate structure may be formed in the recess 101, and the gate structure may include the gate insulation pattern 104a, the polysilicon pattern 110a, the upper metal pattern 114a and the hard mask pattern 116.

Thereafter, impurities may be doped on the substrate 100 to form the impurity regions 120 at upper portions of the substrate 100 adjacent to sides of the gate structure.

In some example embodiments, the doping process for forming the impurity regions 120 may be performed before forming the recess 101 illustrated with reference to FIG. 9.

Figure 11:
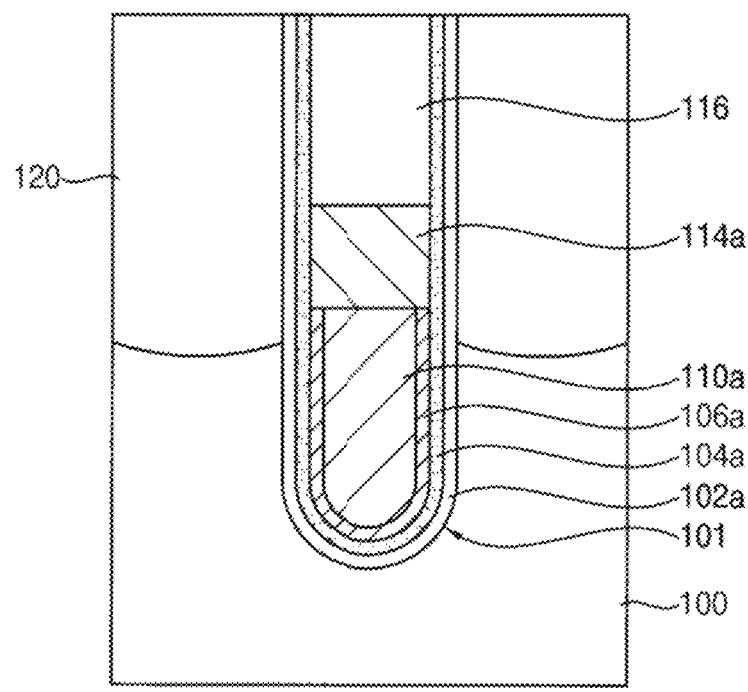

FIG. 11 is a cross-sectional view illustrating a semiconductor device in accordance with example embodiments.

The semiconductor device shown in FIG. 11 may be substantially the same as the semiconductor device shown in FIG. 1, except that a gate structure is formed only in a recess.

Referring to FIG. 11, the interface insulation pattern 102a and the gate insulation pattern 104a may be conformally formed on a sidewall and a bottom of the recess 101.

The threshold voltage controlling metal pattern 106a and the polysilicon pattern 110a may be formed on the gate insulation pattern 104a to fill a lower portion of the recess 101.

The upper metal pattern 114a and the hard mask pattern 116 may be formed on the polysilicon pattern 110a to fill an upper portion of the recess 101.

In example embodiments, a gate structure may include the interface insulation pattern 102a, the gate insulation pattern 104a, the threshold voltage controlling metal pattern 106a, the polysilicon pattern 110a, the upper metal pattern 114a and/or the hard mask pattern 116 stacked. An upper surface of the gate structure may be coplanar with a flat upper surface of the substrate 100.

In some example embodiments, the lower polysilicon pattern may be further formed between the threshold voltage controlling metal pattern 106a and the polysilicon pattern 110a.

In some example embodiments, the diffusion barrier pattern may be further formed between the polysilicon pattern 110a and the hard mask pattern.

The impurity regions 120 may be formed at upper portions of the substrate 100 adjacent to sides of the gate structure. In example embodiments, a bottom of each of the impurity regions 120 may be lower than a bottom of the hard mask pattern 116.

Figure 12:
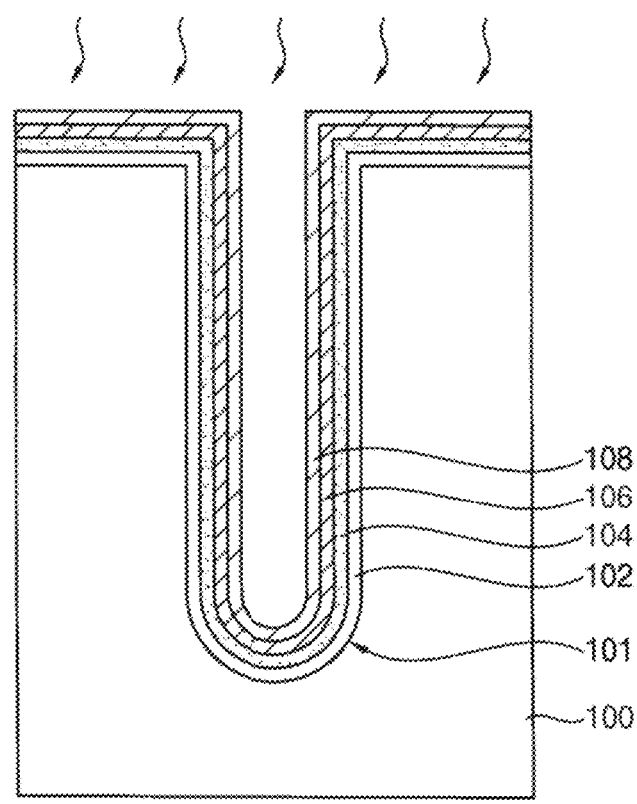
Figure 13:
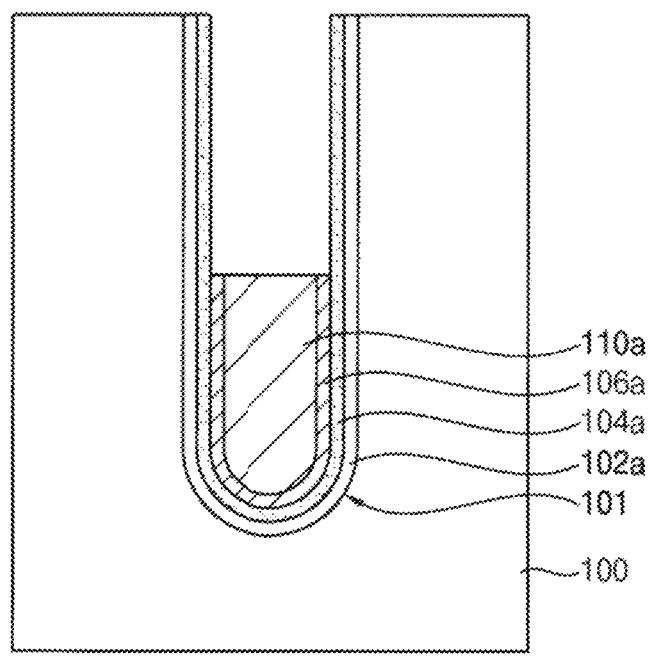

FIGS. 12 and 13 are cross-sectional views illustrating stages of a method of manufacturing a transistor in accordance with example embodiments.

Figure 3:
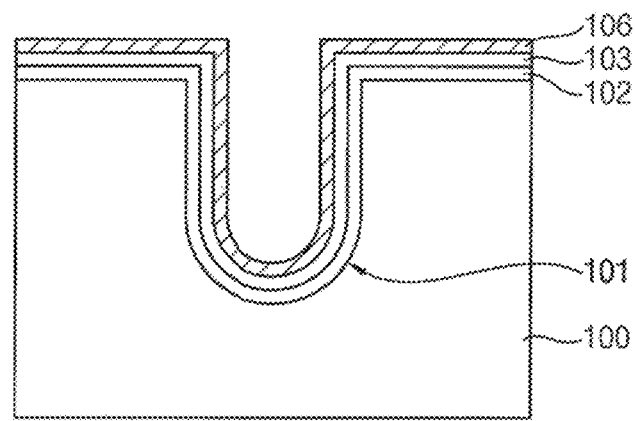
Figure 4B:
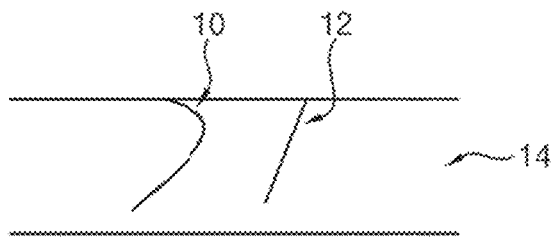
FIG. 4B is concentration gradients of dopants when implanting dopants by ion implantation process, and by diffusion from a polysilicon layer, respectively.

Referring to FIG. 12, the processes as illustrated with reference to FIGS. 3 and 4 are performed. Thus, the interface insulation layer 102, the gate insulation layer 104, the threshold voltage controlling metal layer 106 and/or the lower polysilicon layer 108 may be formed on surfaces of the substrate 100 and the recess 101.

Referring to FIG. 13, the lower polysilicon layer 108 may be removed. Then, the polysilicon layer may be formed on the threshold voltage controlling metal layer 106.

The polysilicon layer, the threshold voltage controlling metal layer 106, the gate insulation layer 104 and the interface insulation layer 102 may be planarized until an upper surface of the substrate 100 may be exposed. The planarization process may include, e.g., a chemical mechanical polishing (CMP) process and/or an etch back process. Subsequently, the polysilicon layer and the threshold voltage controlling metal layer 106 disposed at an upper portion of the recess 101 may be partially removed. Thus, the threshold voltage controlling metal pattern 106a and the polysilicon pattern 110a may be formed in a lower portion of the recess 101. Also, the interface insulation layer 102 and the gate insulation layer 104 formed on the upper surface of the substrate 100 may be removed.

Referring to FIG. 11 again, the upper metal pattern 114a and the hard mask pattern 116 may be formed on the polysilicon pattern 110a. The upper metal pattern 114a and the hard mask pattern 116 may be formed in the recess 101. An upper surface of the hard mask pattern 116 may be coplanar with the upper surface of the substrate 100.

The impurity regions 120 may be formed at upper portions of the substrate 100 adjacent to sides of the gate structure.

Figure 14:
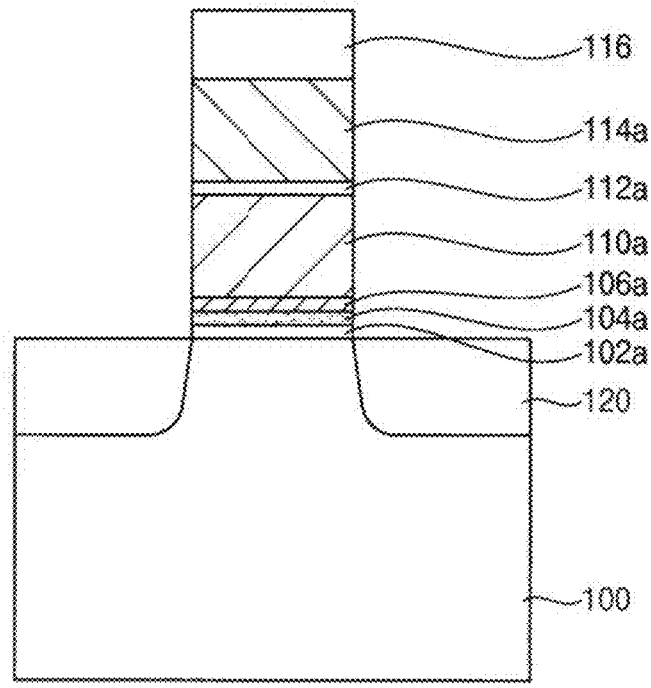
Figure 15:
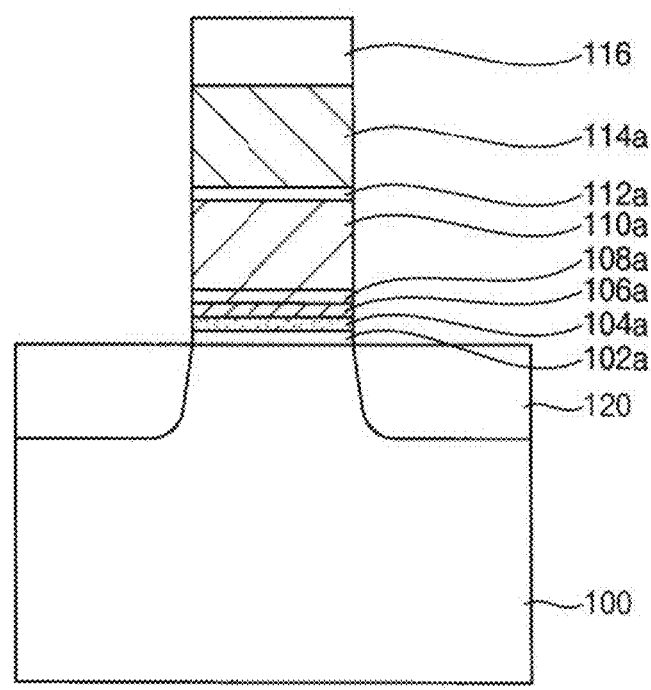

FIG. 14 is a cross-sectional view illustrating a semiconductor device in accordance with example embodiments. FIG. 15 is a cross-sectional view illustrating a semiconductor device in accordance with example embodiments.

The semiconductor device shown in FIG. 14 may be substantially the same as the semiconductor device shown in FIG. 1, except that the semiconductor device is a planar channel transistor. The semiconductor device shown in FIG. 15 may be substantially the same as the semiconductor device shown in FIG. 2, except that the semiconductor device is a planar channel transistor.

Referring to FIG. 14, a gate structure may be formed on a flat surface of the substrate 100, and the gate structure may include the interface insulation pattern 102a, the gate insulation pattern 104a, the threshold voltage controlling metal pattern 106a, the polysilicon pattern 110a, the diffusion barrier pattern 112a, the upper metal pattern 114a and the hard mask pattern 116.

The impurity regions 120 serving as source/drain regions may be formed at upper portions of the substrate 100 adjacent sides of the gate structure.

The transistor shown in FIG. 14 may be manufactured by processes the same as those illustrated with reference to FIGS. 3 to 5, except that the process for forming a recess is not performed.

Referring to FIG. 15, a gate structure may be formed on a flat surface of the substrate 100, and the gate structure may include the interface insulation pattern 102a, the gate insulation pattern 104a, the threshold voltage controlling metal pattern 106a, the lower polysilicon pattern 108a, the polysilicon pattern 110a, the diffusion barrier pattern 112a, the upper metal pattern 114a and the hard mask pattern 116.

The impurity regions 120 serving as source/drain regions may be formed at upper portions of the substrate 100 adjacent sides of the gate structure.

Figure 16:
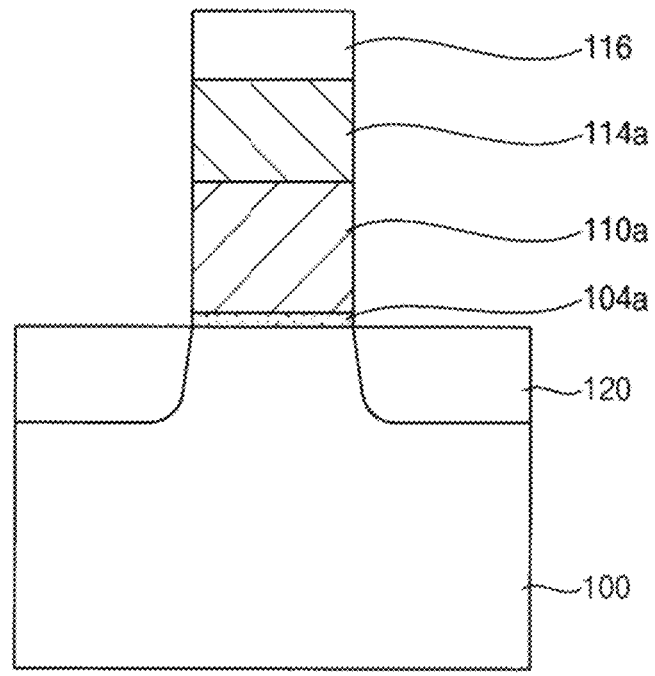
Figure 17:
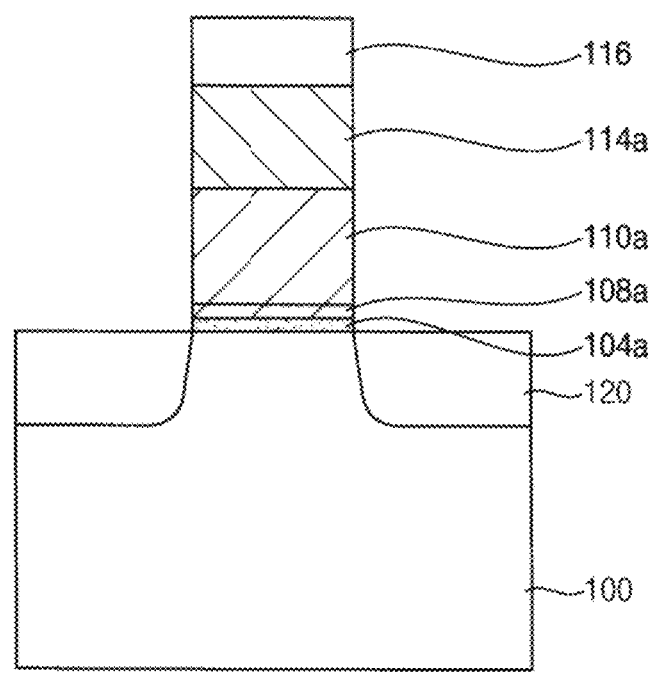

FIG. 16 is a cross-sectional view illustrating a semiconductor device in accordance with example embodiments. FIG. 17 is a cross-sectional view illustrating a semiconductor device in accordance with example embodiments.

The semiconductor device shown in FIG. 16 may be substantially the same as the semiconductor device shown in FIG. 7, except that the semiconductor device is a planar channel transistor. The semiconductor device shown in FIG. 17 may be substantially the same as the semiconductor device shown in FIG. 8, except that the semiconductor device is a planar channel transistor.

Referring to FIG. 16, a gate structure may be formed on a flat surface of the substrate 100, and the gate structure may include the gate insulation pattern 104a, the polysilicon pattern 110a, the upper metal pattern 114a and the hard mask pattern 116.

The impurity regions 120 serving as source/drain regions may be formed at upper portions of the substrate 100 adjacent sides of the gate structure.

The transistor shown in FIG. 16 may be manufactured by processes the same as those illustrated with reference to FIGS. 9 and 10, except that the process for forming a recess is not performed.

Referring to FIG. 17, a gate structure may be formed on a flat surface of the substrate 100, and the gate structure may include the gate insulation pattern 104a, the lower polysilicon pattern 108a, the polysilicon pattern 110a, the upper metal pattern 114a and the hard mask pattern 116.

The impurity regions 120 serving as source/drain regions may be formed at upper portions of the substrate 100 adjacent sides of the gate structure.

Figure 18:
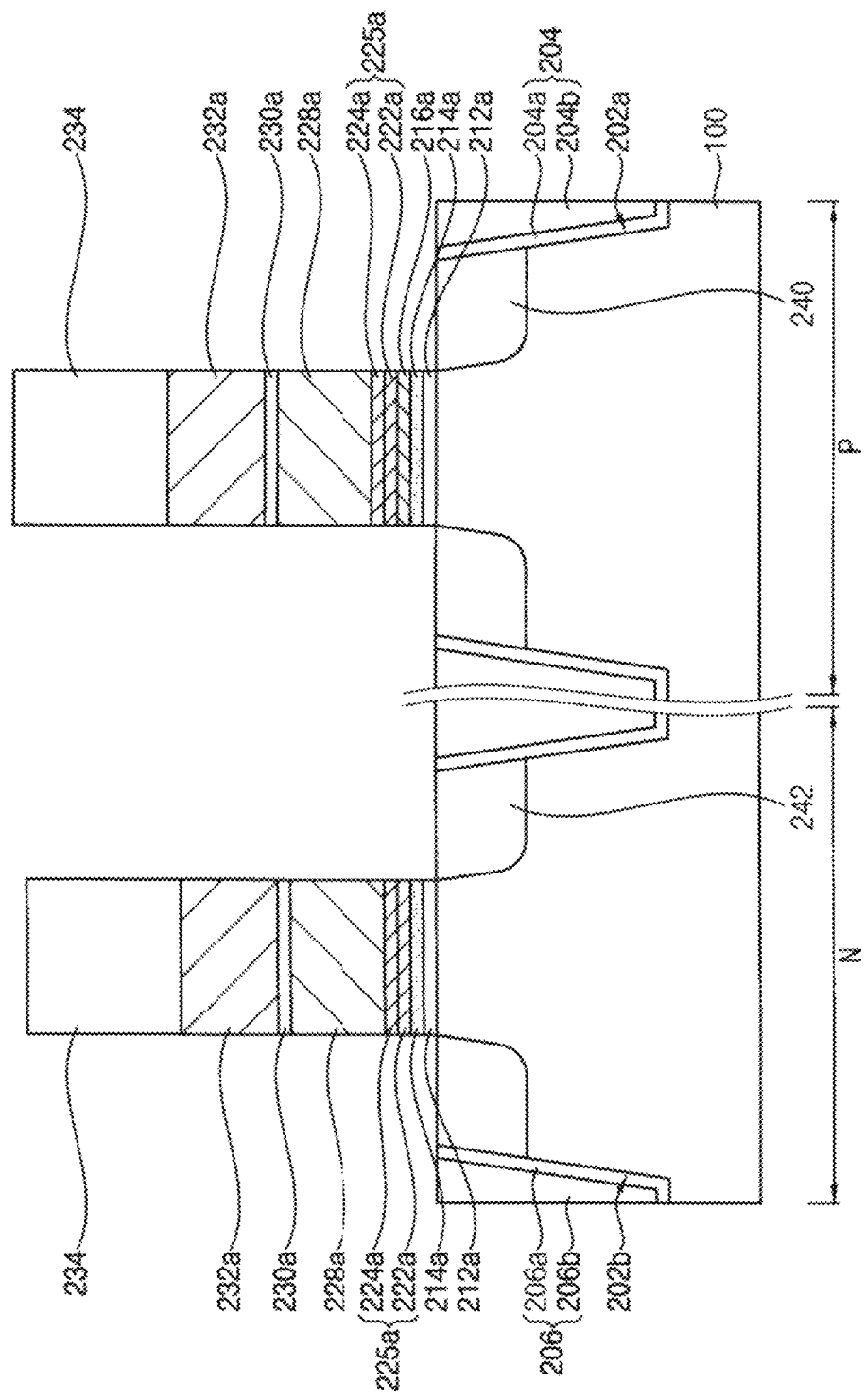

FIG. 18 is a cross-sectional view illustrating a semiconductor device in accordance with example embodiments.

Referring to FIG. 18, the substrate 100 may include a PMOS transistor region P and an NMOS transistor region N. The substrate 100 may include a silicon substrate.

A first isolation trench 202a may be formed at the substrate in the PMOS transistor region P, and a second isolation trench 202b may be formed at the substrate in the NMOS transistor region N. First and second isolation patterns 204 and 206 may be formed in the first and second isolation trenches 202a and 202b, respectively. The first and second isolation patterns 204 and 206 may include silicon oxide and/or silicon nitride. The substrate 100 may be divided into an active region and a field region by the first and second isolation patterns 204 and 206.

For example, the first and second isolation patterns 204 and 206 may include a silicon oxide layer 204a and 206a and a silicon nitride layer 204b and 206b sequentially stacked. The silicon oxide layer 204a and 206a may be conformally formed on sidewalls and bottom surfaces of the first and second isolation trenches 202a and 202b.

For another example, the first and second isolation patterns 204 and 206 may have a silicon nitride layer and a silicon oxide layer sequentially stacked. That is, the silicon nitride layer may be conformally formed on sidewalls and bottom surfaces of the first and second isolation trenches 202a and 202b.

In example embodiments, a difference between heights of top surfaces of the first and second isolation patterns 204 and 206 may be less than about 100 Å. For example, the difference between the heights of the top surfaces of the first and second isolation patterns 204 and 206 may be less than about 30 Å. Therefore, defects caused by the difference between the heights of the top surfaces of the first and second isolation patterns 204 and 206 may decrease.

A first gate structure may be formed on the substrate 100 in the PMOS transistor region P.

The first gate structure may include an interface insulation pattern 212a, a gate insulation pattern 214a, a first threshold voltage controlling metal pattern 216a, a second threshold voltage controlling metal pattern 225a, a polysilicon pattern 228a, a diffusion barrier pattern 230a, an upper metal pattern 232a and/or a hard mask pattern 234 stacked.

A second gate structure may be formed on substrate in the NMOS transistor region N.

The second gate structure may include the interface insulation pattern 212a, the gate insulation pattern 214a, the second threshold voltage controlling metal pattern 225a, the polysilicon pattern 228a, the diffusion barrier pattern 230a, the upper metal pattern 232a and/or the hard mask pattern 234 stacked. The second gate structure may have a stacked structure the same as a stacked structure of the first gate structure, except that the first threshold voltage controlling metal pattern 216a is not formed.

The first gate structure may directly contact the surface of the substrate 100 in the PMOS transistor region, and an epitaxial layer may not be formed between the surface of the substrate 100 and the first gate structure. That is, a silicon germanium layer or a carbon doped silicon germanium layer may not be formed between the surface of the substrate 100 and the first gate structure.

The second gate structure may directly contact the surface of the substrate 100 in the NMOS transistor region N. Thus, bottoms of the first and second gate structures may be coplanar with each other.

The interface insulation pattern 212a, the diffusion barrier pattern 230a, the upper metal pattern 232a and/or the hard mask pattern 234 included in the first and second gate structures may include materials substantially the same as materials of the interface insulation pattern, the diffusion barrier pattern, the upper metal pattern and/or the hard mask pattern illustrated with reference to FIG. 1, respectively. The polysilicon pattern 228a may include N-type impurities or P-type impurities.

In example embodiments, the first threshold voltage controlling metal pattern 216a may be formed as a single metal pattern. The first threshold voltage controlling metal pattern 216a may include, e.g., titanium nitride.

In example embodiments, a thickness of the first threshold voltage controlling metal pattern 216a may be less than about 100 Å. For example, the thickness of the first threshold voltage controlling metal pattern 216a may be about 10 Å to about 50 Å. A difference between heights of top surfaces of the first and second gate structures may be changed depending on a thickness of the first threshold voltage controlling metal pattern 216a. For example, the difference between the heights of the top surfaces of the first and second gate structures may be less than about 100 Å. Thus, defects caused by the difference between the heights of the top surfaces of the first and second gate structures may decrease.

In example embodiments, the second threshold voltage controlling metal pattern 225a may be formed as a single metal pattern or two or more metal pattern. For example, the second threshold voltage controlling metal pattern 225a may include a lanthanum pattern 222a and a titanium nitride layer pattern 224a stacked.

In example embodiments, first dopants may be doped in the gate insulation pattern 214a and on upper and lower interfaces of the gate insulation pattern 214a. That is, the first dopants may be doped within and at at least one surface of the gate insulation pattern 214a and at an upper surface of the interface insulation pattern 212a contacting the gate insulation pattern 214a. The first dopants may be dopants for controlling a threshold voltage of the PMOS transistor.

In example embodiments, the first dopants may act as a negative charge in the gate insulation pattern 214a, so that an effective work function of the first gate structure may be changed. Thus, the threshold voltage of the PMOS transistor may be controlled by the first dopants. In example embodiments, the first dopants may include fluorine, gallium or BF$_2$. For example, the threshold voltage of the PMOS transistor may be lowered by the first dopants.

First impurity regions 240 serving as source/drain regions may be formed at upper portions of the substrate 100 in the PMOS transistor region adjacent to sides of the first gate structure.

Second impurity regions 242 serving as source/drain regions may be formed at upper portions of the substrate 100 in the NMOS transistor region adjacent to sides of the second gate structure.

As described above, the first dopants may include in the gate insulation pattern 214a and on the upper and lower interfaces of the gate insulation pattern 214a, and thus the threshold voltage of the PMOS transistor may be easily controlled. For example, although the first threshold voltage controlling metal pattern 216a may include single layer (pattern) instead of a plurality of layers (patterns) stacked, the threshold voltage of the PMOS transistor may be controlled to have a target threshold voltage.

In addition, the PMOS transistor may not be formed on an epitaxial layer (for example, a silicon germanium layer or a carbon doped silicon germanium layer). Although the PMOS transistor may be formed on a silicon substrate, the threshold voltage of the PMOS transistor may be controlled to have the target threshold voltage.

As described above, the number of stacked layers of the first threshold voltage controlling metal pattern 216a may be reduced, and the silicon germanium layer or the carbon doped silicon germanium layer may not be formed below the PMOS transistor. Thus, the difference between the heights of the top surfaces of the first and second gate structures may decrease.

Figure 19:
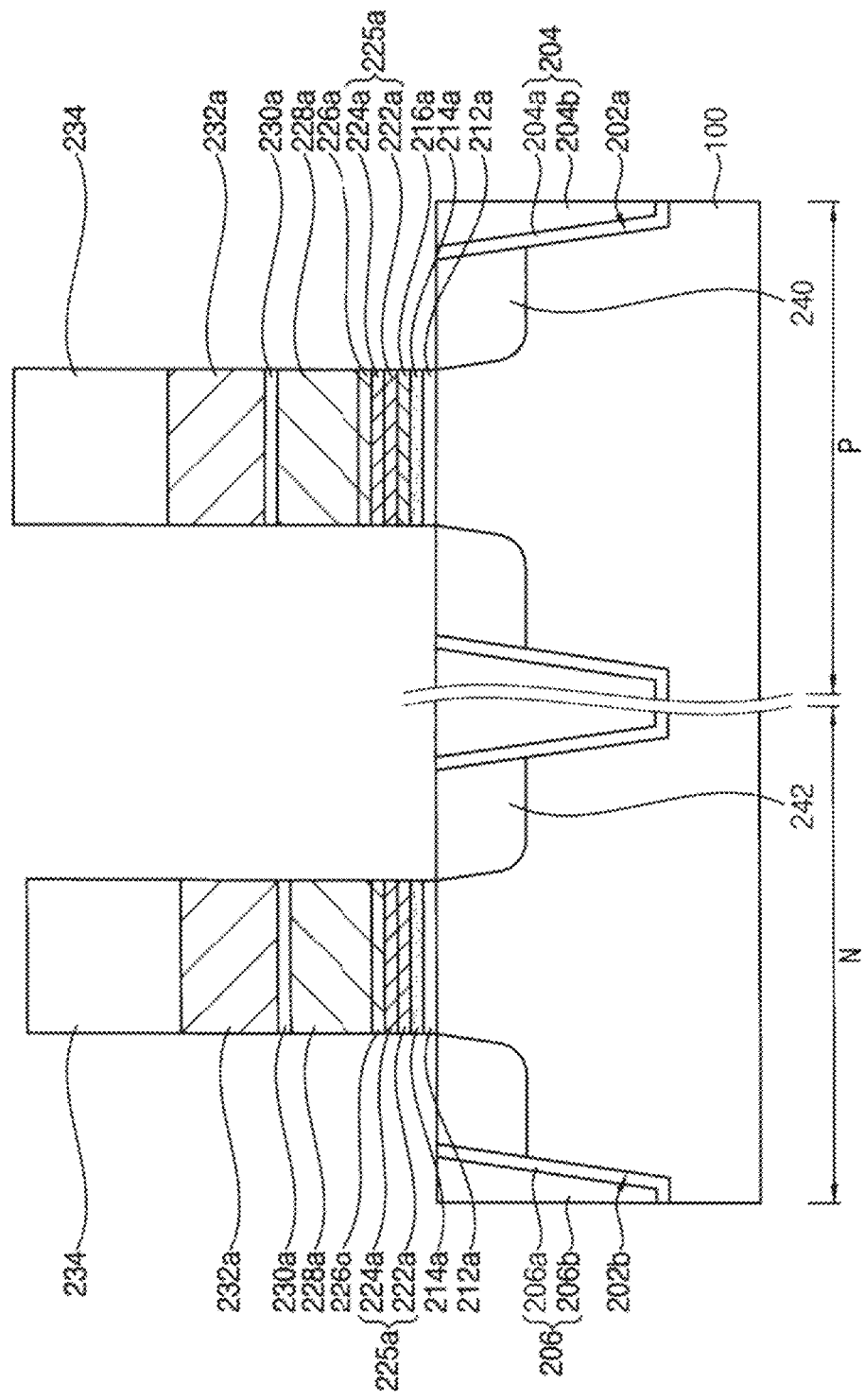

FIG. 19 is a cross-sectional view illustrating a semiconductor device in accordance with example embodiments.

The semiconductor device shown in FIG. 19 may be substantially the same as the semiconductor device shown in FIG. 18, except that lower polysilicon patterns are further included in the first gate structure and the second gate structure, respectively.

Referring to FIG. 19, a first gate structure may include the interface insulation pattern 212a, the gate insulation pattern 214a, the first threshold voltage controlling metal pattern 216a, the second threshold voltage controlling metal pattern 225a, the lower polysilicon pattern 226a, the polysilicon pattern 228a, the diffusion barrier pattern 230a, the upper metal pattern 232a and the hard mask pattern 234a stacked.

A second gate structure may include the interface insulation pattern 212a, the gate insulation pattern 214a, the second threshold voltage controlling metal pattern 225a, the lower polysilicon pattern 226a, the polysilicon pattern 228a, the diffusion barrier pattern 230a, the upper metal pattern 232a and the hard mask pattern 234a stacked.

FIGS. 20 to 24 are cross-sectional views illustrating stages of a method of manufacturing a semiconductor device in accordance with example embodiments.

Figure 20:
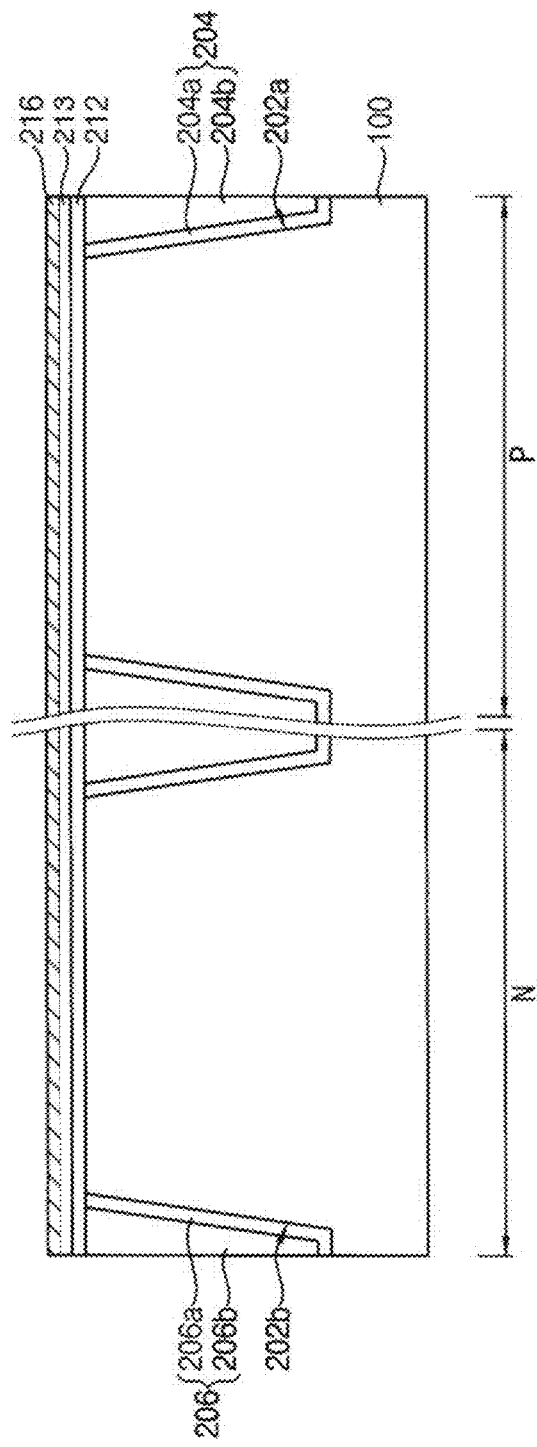

Referring to FIG. 20, portions of the substrate 100 may be etched to form a first isolation trench 202a at the substrate 100 in the PMOS transistor region P and a second isolation trench 202b at the substrate 100 in the NMOS transistor region N.

A first isolation pattern 204 may be formed in the first isolation trench 202a, and a second isolation pattern 206 may be formed in the second isolation trench 202b. In example embodiments, an isolation layer may be formed in the first and second isolation trenches 202a and 202b, and the isolation layer may be planarized until an upper surface of the substrate 100 may be exposed to form the first and second isolation patterns 204 and 206. By the planarization process, upper surfaces of the first and second isolation patterns 204 may be coplanar with each other.

An interface insulation layer 212, a preliminary gate insulation layer 213, and a first threshold voltage controlling metal layer 216 may be formed on the substrate 100 and the first and second isolation patterns 204 and 206.

As described above, a process for forming an epitaxial layer on the substrate in the PMOS transistor region may not be performed. When the epitaxial layer may be selectively formed on the substrate in the PMOS transistor region, additional processes such as forming a blocking pattern on the substrate in the NMOS transistor region and removing the blocking pattern may be performed. When the additional processes are performed, an upper portion of the first isolation pattern may be partially removed, and thus a difference between heights of top surfaces of the first and second isolation patterns may occur.

However, in example embodiments, the additional processes may not be performed, so that a difference between heights of top surfaces of the first and second isolation patterns 204 and 206 may hardly occur. In example embodiments, in the semiconductor device manufactured by subsequent processes, the difference between the heights of the top surfaces of the first and second isolation patterns 204 and 206 may be less than about 100 Å. For example, the difference between the heights of the top surfaces of the first and second isolation patterns 204 and 206 may be less than about 30 Å.

In example embodiments, plasma nitridation and heat treatment may be further performed after forming the interface insulation layer 212. In example embodiments, the first threshold voltage controlling metal layer 216 may be formed as a single layer. The first threshold voltage controlling metal layer 216 may include titanium nitride.

Figure 21:
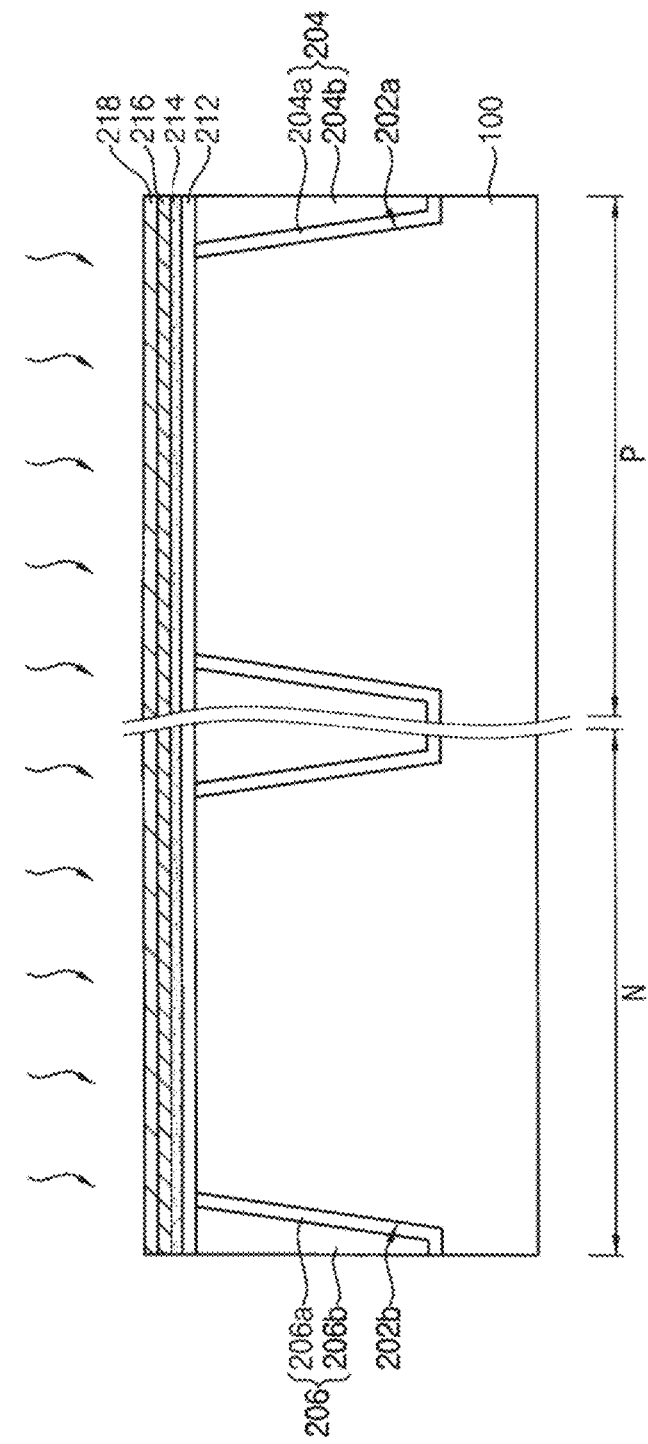

Referring to FIG. 21, a first lower polysilicon layer 218 may be formed on the first threshold voltage controlling metal layer.

During the process for forming the first lower polysilicon layer 218, second dopants may be doped in situ. The first lower polysilicon layer 218 may be a doping source layer for supplying first dopants to the preliminary gate insulation layer. In example embodiments, the second dopants may include fluorine, gallium or $BF_2$.

Then, the first lower polysilicon layer 218 may be heat-treated to downwardly diffuse the second dopants in the first lower polysilicon layer 218, so that a gate insulation layer 214 doped with first dopants may be formed. The first dopants may be substantially the same as the second dopants. The first dopants may be included in the gate insulation layer 214 and on upper and lower interfaces of the gate insulation layer 214. That is, the first dopants may be doped within and at at least one surface of the gate insulation layer 214 and at an upper surface of the interface insulation layer 212 contacting the gate insulation layer 214.

In some example embodiments, the first lower polysilicon layer 218 may not be formed. Also, the first dopants may be doped into the preliminary gate insulation layer 213 through an ion implantation process, so that the gate insulation layer 214 may be formed. Thus, the first dopants may be included in the gate insulation layer 214 and on the upper and lower interfaces of the gate insulation layer 214. In example embodiments, in the ion implantation process, implantation energy may be about 0.1 KeV to about 5 KeV, and a dose may be about 1E13 ions/$cm^2$ to about 5E15 ions/$cm^2$.

In some example embodiments, the process for forming the first lower polysilicon layer and the ion implantation process of the first dopants may not be performed in this step.

Figure 22:
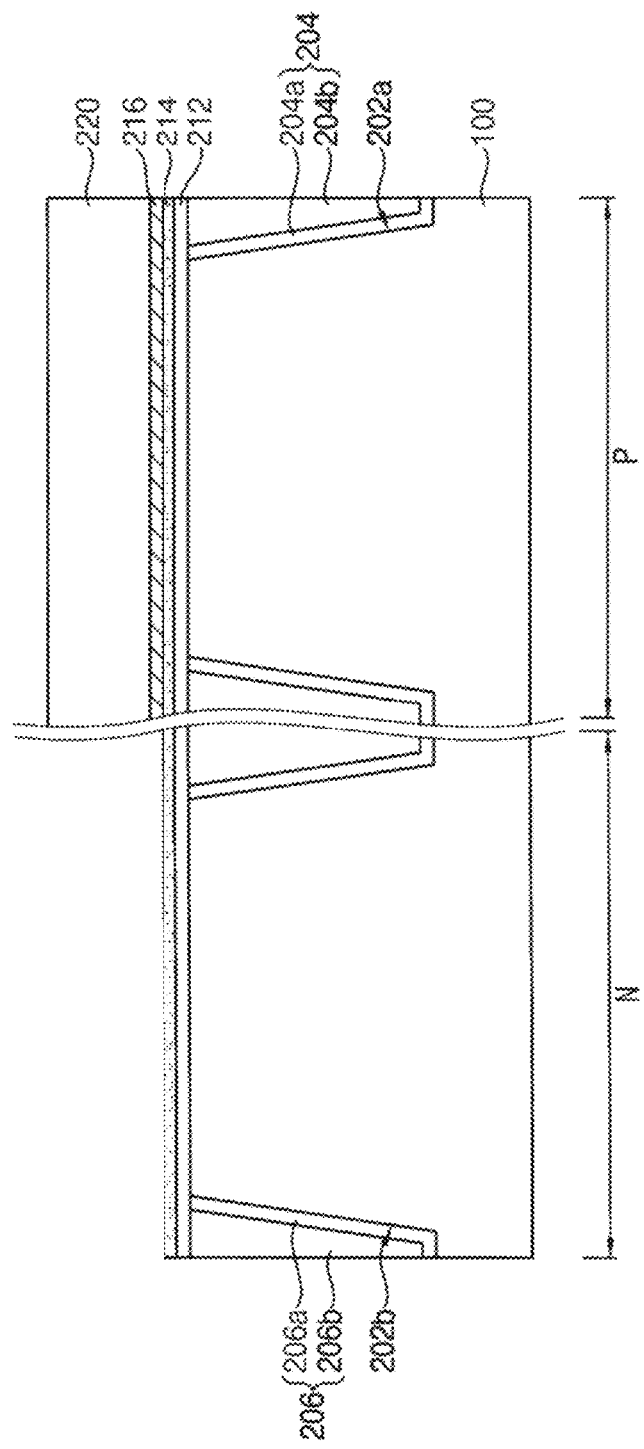

Referring to FIG. 22, the first lower polysilicon layer 218 may be removed to expose the first threshold voltage controlling metal layer 216.

A mask pattern 220 may be formed on the first threshold voltage controlling metal layer 216 to cover the first threshold voltage controlling metal layer 216 in the PMOS transistor region. The mask pattern 220 may include, e.g., a photoresist pattern.

The first threshold voltage controlling metal layer 216 exposed by the mask pattern 220 may be etched, and then the mask pattern 220 may be removed. Thus, the first threshold voltage controlling metal layer 216 may be formed only on the gate insulation layer 214 in the PMOS transistor region. Also, the gate insulation layer 214 may be exposed in the NMOS transistor region.

Figure 23:
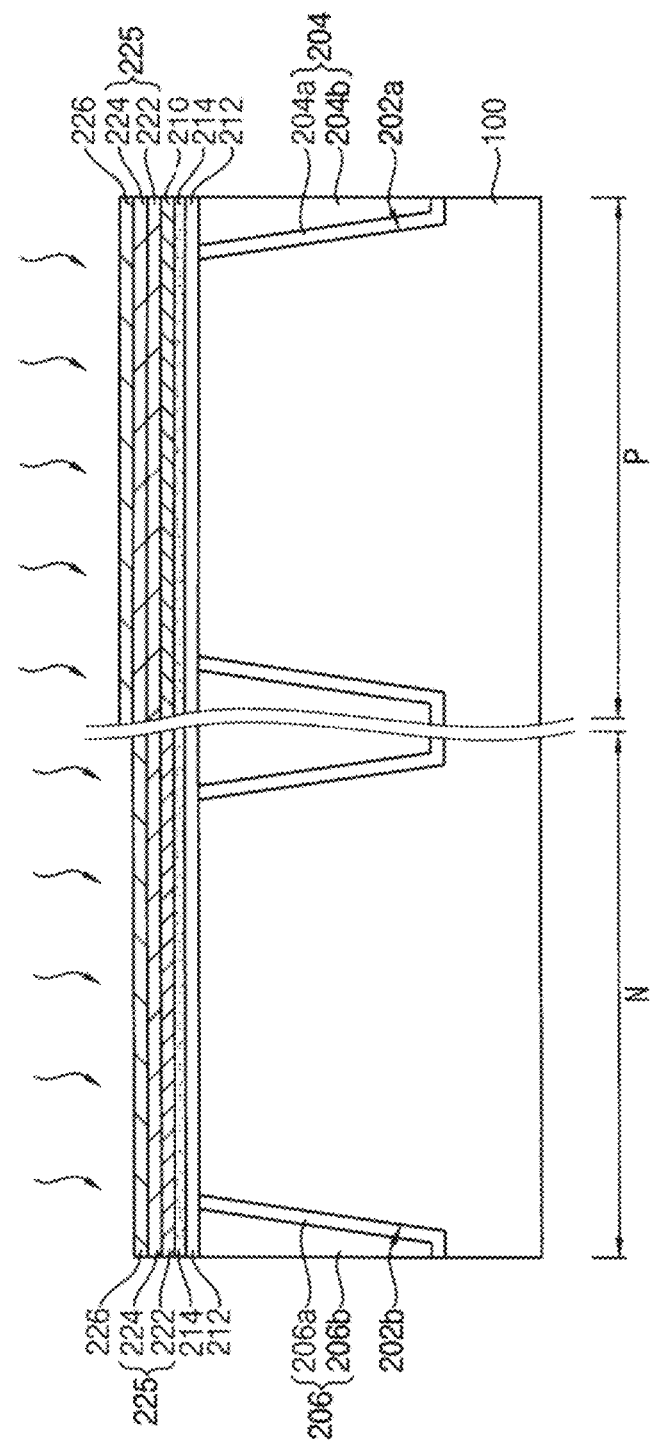

Referring to FIG. 23, a second threshold voltage controlling metal layer 225 may be formed on the gate insulation layer 214 and the first threshold voltage controlling metal layer 216.

A second lower polysilicon layer 226 may be formed on the second threshold voltage controlling metal layer 225.

During the deposition process for forming the second lower polysilicon layer 226, the second dopants may be doped in situ. Thereafter, the second lower polysilicon layer 226 may be heat-treated to downwardly diffuse the second dopants in the second lower polysilicon layer 226. Thus, the first dopants may be doped in the gate insulation layer 214 and on the upper and lower interfaces of the gate insulation layer 214.

In some example embodiments, the second lower polysilicon layer 226 may not be formed, and the first dopants may be doped in the gate insulation layer 214 and on upper and lower interfaces of the gate insulation layer 214 by an ion implantation process.

In some example embodiments, in the process illustrated with reference to FIG. 21, if the first dopants are sufficiently doped in the gate insulation layer 214 and on the upper and lower interfaces of the gate insulation layer 214, the doping process illustrated with reference to FIG. 23 may not be performed.

In some example embodiments, if the processes illustrated with reference to FIG. 21 are not performed, the second lower polysilicon layer 226 may be formed, and then diffusing the second dopants or ion implantation process of the first dopants may be performed in this step.

As described above, the first dopants may be included in the gate insulation layer 214 and on the upper and lower interfaces of the gate insulation layer 214 by at least one of the process illustrated with reference to FIG. 21 and the process illustrated with reference to FIG. 23.

Figure 24:
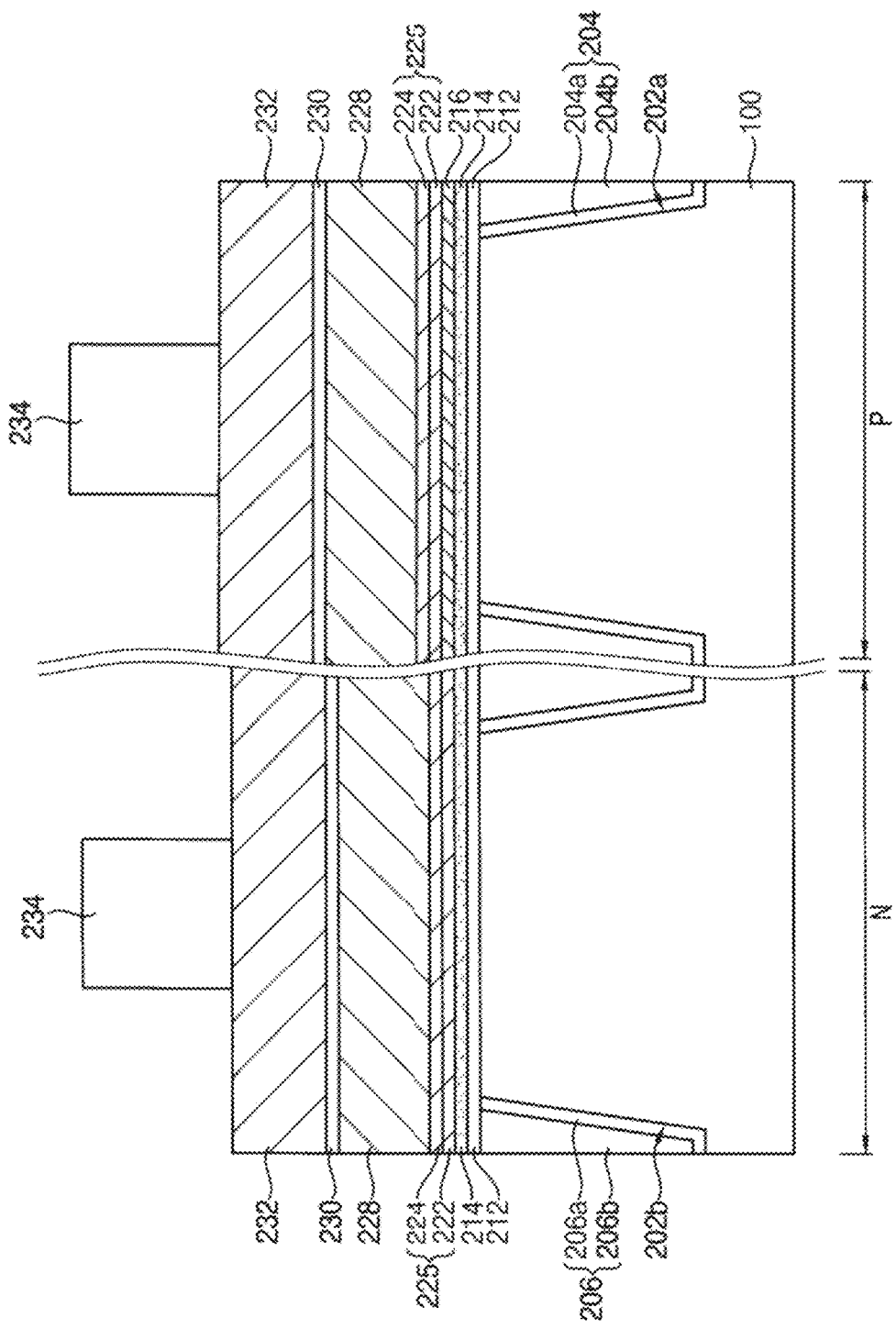

Referring to FIG. 24, the second lower polysilicon layer 226 may be removed to expose an upper surface of the second threshold voltage controlling metal layer 225.

In some example embodiments, the removing process of the second lower polysilicon layer 226 may not be performed. When the subsequent processes are performed in the same manner without removing the second lower polysilicon layer 226, the semiconductor device shown in FIG. 19 may be manufactured.

A polysilicon layer 228 may be formed on the second threshold voltage controlling metal layer 225. In the process for forming the polysilicon layer 228, N-type impurities or P-type impurities may be doped in situ.

A diffusion barrier layer 230, an upper metal layer 232 and a hard mask layer may be sequentially formed on the polysilicon layer 228. The hard mask layer may be patterned to form a hard mask pattern 234.

Referring to FIG. 18 again, the upper metal layer 232, the diffusion barrier layer 230, the polysilicon layer 228, the second threshold voltage controlling metal layer 225, the first threshold voltage controlling metal layer 216, the gate insulation layer 214 and the interface insulation layer 212 may be etched to form a first gate structure formed on the substrate in the PMOS transistor region and a second gate structure formed on the substrate in the NMOS transistor region.

Figure 25:
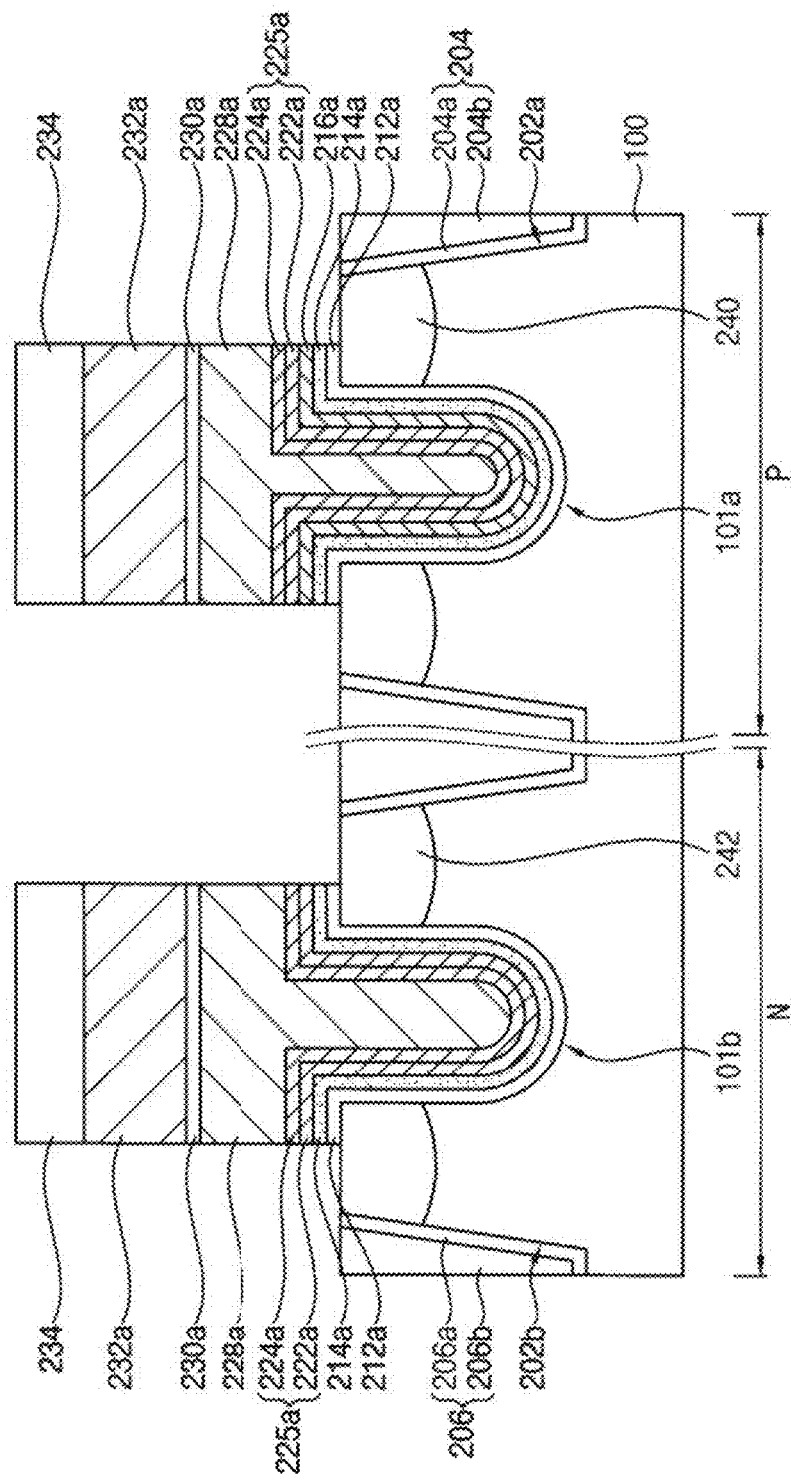

FIG. 25 is a cross-sectional view illustrating a semiconductor device in accordance with example embodiments. The semiconductor device shown in FIG. 25 may be substantially the same as the semiconductor device illustrated in FIG. 18, except that the semiconductor device is a recessed channel transistor.

Referring to FIG. 25, a first recess 101a may be formed at the substrate 100 in the PMOS transistor region, and a second recess 101b may be formed at the substrate 100 in the NMOS transistor region.

A first gate structure may be formed in the first recess 101a, and a second gate structure may be formed in the second recess 101b.

The first gate structure may include the interface insulation pattern 212a, the gate insulation pattern 214a, the first threshold voltage controlling metal pattern 216a, the second threshold voltage controlling metal pattern 225a, the polysilicon pattern 228a, the diffusion barrier pattern 230a, the upper metal pattern 232a and the hard mask pattern 234 stacked.

In example embodiments, the interface insulation pattern 212a, the gate insulation pattern 214a, the first threshold voltage controlling metal pattern 216a and the second threshold voltage controlling metal pattern 225a included in the first gate structure may be conformally formed on a surface of the first recess 101a. The polysilicon pattern 228a included in the first gate structure may fill a remaining portion of the first recess 101a.

In example embodiments, an upper surface of the polysilicon pattern 228a included in the first gate structure may be higher than a flat upper surface of the substrate 100. Therefore, the upper surface of the first gate structure may be higher than the flat upper surface of the substrate 100.

The second gate structure may include the interface insulation pattern 212a, the gate insulation pattern 214a, the second threshold voltage controlling metal pattern 225a, the polysilicon pattern 228a, the diffusion barrier pattern 230a, the upper metal pattern 232a and the hard mask pattern 234 stacked.

In example embodiments, the interface insulation pattern 212a, the gate insulation pattern 214a, and the second threshold voltage controlling metal pattern 225a included in the second gate structure may be conformally formed on a surface of the second recess 101b. The polysilicon pattern 228a included in the second gate structure may fill a remaining portion of the second recess.

In example embodiments, an upper surface of the polysilicon pattern 228a included in the second gate structure may be higher than the flat upper surface of the substrate 100. Therefore, the upper surface of the second gate structure may be higher than the flat upper surface of the substrate 100.

The first impurity regions 240 serving as source/drain regions may be formed at upper portions of the substrate 100 adjacent to sides of the first gate structure in the PMOS transistor region.

The second impurity regions 242 serving as source/drain regions may be formed at upper portions of the substrate 100 adjacent to sides of the second gate structure in the NMOS transistor region.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
 a substrate including a PMOS transistor region and a NMOS transistor region;

a first gate structure on the PMOS transistor region of the substrate, the first gate structure including an interfacial insulation pattern, a gate insulation pattern including a metal oxide, a first threshold voltage controlling metal pattern, a second threshold voltage controlling metal pattern, and a polysilicon pattern stacked, the gate insulation pattern directly contacting the first threshold voltage controlling metal pattern; and a second gate structure on the NMOS transistor region of the substrate, the second gate structure including the interfacial insulation pattern, the gate insulation pattern including the metal oxide, the second threshold voltage controlling metal pattern, and the polysilicon pattern stacked;

wherein the first gate structure and the second gate structure contacts a surface of the substrate.

2. The semiconductor device of claim 1, wherein the first threshold voltage controlling metal pattern includes titanium nitride.

3. The semiconductor device of claim 1, wherein the first threshold voltage controlling metal pattern has a thickness less than 100 Å.

4. The semiconductor device of claim 1, wherein the second threshold voltage controlling metal pattern has a lanthanum pattern and a titanium nitride layer pattern stacked.

5. The semiconductor device of claim 1, wherein, in the first and second gate structures, first dopants are within and at at least one surface of the gate insulation pattern and at an upper surface of the interfacial insulation pattern contacting the gate insulation pattern, and the first dopants include at least fluorine.

6. The semiconductor device of claim 1, wherein, in the first and second gate structures, the polysilicon pattern directly contacts the second threshold voltage controlling metal pattern, and the polysilicon pattern is doped with N-type or P-type impurities.

7. The semiconductor device of claim 1, wherein the first gate structure and the second gate structure have different stacked structures.

8. The semiconductor device of claim 1, wherein the substrate includes silicon substrate.

9. A semiconductor device, comprising:
a substrate including a PMOS transistor region and a NMOS transistor region;
a first gate structure on the PMOS transistor region of the substrate, the first gate structure including an interfacial insulation pattern, a gate insulation pattern including a metal oxide, a first threshold voltage controlling metal pattern, a second threshold voltage controlling metal pattern, a lower polysilicon pattern and a polysilicon pattern stacked; and
a second gate structure on the NMOS transistor region of the substrate, the second gate structure including the interfacial insulation pattern, the gate insulation pattern including the metal oxide, the second threshold voltage controlling metal pattern, the lower polysilicon pattern and the polysilicon pattern stacked;
wherein, in the first and second gate structures, first dopants are within and at at least one surface of the gate insulation pattern and at an upper surface of the interfacial insulation pattern contacting the gate insulation pattern, and the first dopants include at least fluorine.

10. The semiconductor device of claim 9, wherein, in the first and second gate structures,
the lower polysilicon pattern contacts the second threshold voltage controlling metal pattern, and the lower polysilicon pattern includes second dopants including at least fluorine; and
the polysilicon pattern is formed on the lower polysilicon pattern, the polysilicon pattern is doped with N-type or P-type impurities.

11. The semiconductor device of claim 9, wherein the first gate structure and the second gate structure have different stacked structures.

12. The semiconductor device of claim 9, wherein the substrate includes silicon substrate.

13. The semiconductor device of claim 9, wherein the first gate structure and the second gate structure contacts a surface of the substrate.

14. The semiconductor device of claim 9, wherein the first threshold voltage controlling metal pattern includes titanium nitride.

15. The semiconductor device of claim 9, wherein the first threshold voltage controlling metal pattern has a thickness less than 100 Å.

16. The semiconductor device of claim 9, wherein the second threshold voltage controlling metal pattern has a lanthanum pattern and a titanium nitride layer pattern stacked.

* * * * *